(12) United States Patent
de Groot et al.

(10) Patent No.: US 9,746,348 B2
(45) Date of Patent: *Aug. 29, 2017

(54) DOUBLE PASS INTERFEROMETRIC ENCODER SYSTEM

(71) Applicant: Zygo Corporation, Middlefield, CT (US)

(72) Inventors: Peter J. de Groot, Middletown, CT (US); Jan Liesener, Middletown, CT (US)

(73) Assignee: Zygo Corporation, Middlefield, CT (US)

( * ) Notice: Subject to any disclaimer, the term of this patent is extended or adjusted under 35 U.S.C. 154(b) by 294 days.

This patent is subject to a terminal disclaimer.

(21) Appl. No.: 14/666,782

(22) Filed: Mar. 24, 2015

(65) Prior Publication Data

US 2015/0292913 A1 Oct. 15, 2015

Related U.S. Application Data

(63) Continuation of application No. 13/671,920, filed on Nov. 8, 2012, now Pat. No. 9,025,161.

(Continued)

(51) Int. Cl.
*G01B 11/02* (2006.01)
*G01D 5/26* (2006.01)
(Continued)

(52) U.S. Cl.
CPC ............ *G01D 5/266* (2013.01); *G01D 5/38* (2013.01); *G03F 7/70775* (2013.01)

(58) Field of Classification Search
CPC ............ G01B 9/02017; G01B 9/02018; G01D 5/226; G01D 5/38; G03F 7/70775
See application file for complete search history.

(56) References Cited

U.S. PATENT DOCUMENTS 4,629,886 A 12/1986 Akiyama et al.
4,895,447 A 1/1990 Jarisch et al.
(Continued)

FOREIGN PATENT DOCUMENTS

CN 1435675 8/2003 ............ G01B 11/00
CN 101676692 3/2010 ............ G01D 5/36
(Continued)

OTHER PUBLICATIONS

A Communication from the European Patent Office for EPO Application No. 12 847 106.7 by Examiner Michael Stenger dated Aug. 4, 2015 (5 pages).

(Continued)

*Primary Examiner* — Michael A Lyons
(74) *Attorney, Agent, or Firm* — Fish & Richardson P.C.

(57) ABSTRACT

An encoder head includes one or more components arranged to: i) direct a first incident beam to the diffractive encoder scale at a first incident angle with respect to the encoder scale; ii) receive a first return beam from the encoder scale at a first return angle, the first return angle being different from the first incident angle; iii) redirect the first return beam to the encoder scale as a second incident beam at a second incident angle; and iv) receive a second return beam back from the encoder scale at a second return angle, the second return angle being different from the second incident angle, in which a difference between the first incident angle and second incident angle is less than a difference between the first incident angle and the first return angle and less than a difference between the second incident angle and the second return angle.

48 Claims, 16 Drawing Sheets

Related U.S. Application Data

(60) Provisional application No. 61/557,755, filed on Nov. 9, 2011.

(51) Int. Cl.
  *G01D 5/38* (2006.01)
  *G03F 7/20* (2006.01)

(56) References Cited

U.S. PATENT DOCUMENTS

| | | | |
|---|---|---|---|
| 5,035,507 | A | 7/1991 | Nishioki et al. |
| 5,442,172 | A | 8/1995 | Chiang et al. |
| 5,483,343 | A | 1/1996 | Iwamoto et al. |
| 5,498,870 | A | 3/1996 | Ishizuka |
| 7,394,550 | B2 | 7/2008 | Takahashi et al. |
| 7,440,113 | B2 | 10/2008 | Trutna, Jr. et al. |
| 7,545,507 | B2 | 6/2009 | Schluchter et al. |
| 8,300,233 | B2 | 10/2012 | Deck et al. |
| 9,025,161 | B2 * | 5/2015 | de Groot ................ G01D 5/266 356/499 |
| 2003/0141441 | A1 | 7/2003 | Kawano et al. |
| 2006/0039006 | A1 | 2/2006 | Van Der Pasch |
| 2006/0092428 | A1 | 5/2006 | Holzapfel et al. |
| 2007/0013920 | A1 | 1/2007 | Holzapfel |
| 2007/0051884 | A1 | 3/2007 | Romanov et al. |
| 2007/0146722 | A1 | 6/2007 | Trutna, Jr. et al. |
| 2008/0151229 | A1 | 6/2008 | Hill |
| 2008/0285051 | A1 | 11/2008 | Hill |
| 2008/0304079 | A1 | 12/2008 | Schluchter et al. |
| 2009/0268210 | A1 | 10/2009 | Prince |
| 2010/0072348 | A1 | 3/2010 | Takahashi |
| 2010/0128283 | A1 | 5/2010 | Liesener et al. |
| 2010/0297561 | A1 | 11/2010 | Beerens et al. |
| 2011/0255096 | A1 | 10/2011 | Deck et al. |
| 2012/0032067 | A1 | 2/2012 | Goodwin et al. |
| 2012/0154780 | A1 | 6/2012 | Demarest |
| 2012/0194824 | A1 | 8/2012 | de Groot et al. |
| 2013/0128255 | A1 | 5/2013 | Liu |

FOREIGN PATENT DOCUMENTS

| | | | | |
|---|---|---|---|---|
| EP | 0 589 477 | | 3/1994 | ............... G01D 5/38 |
| EP | 1 837 630 | | 9/2007 | ............... G01D 5/38 |
| JP | 2-298816 | | 12/1990 | ............... G01D 5/38 |
| JP | 2-504553 | | 12/1990 | ............... G01D 5/38 |
| JP | 2006-177876 | | 7/2006 | ............... G01D 5/38 |
| JP | 2007-10659 | | 1/2007 | ............... G01D 5/38 |
| JP | 2007-171206 | | 7/2007 | ............... G01B 9/02 |
| JP | 2008-503745 | | 2/2008 | ............... G01D 5/26 |
| JP | 2010-38654 | | 2/2010 | ............... G01D 5/38 |
| WO | WO 89/05964 | | 6/1989 | ............... G01D 5/38 |
| WO | WO 2005/124282 | | 12/2005 | ............... G01D 5/00 |
| WO | WO 2011/126610 | | 10/2011 | ............... G01D 5/38 |

OTHER PUBLICATIONS

Chinese Office Action for Chinese Application No. 201280066526.9 dated Sep. 22, 2015 (17 pages).

Japanese Office Action for Japanese Application No. 2015-048528 dated Mar. 28, 2016 (6 pages).

JP Notification of Reasons for Refusal for JP Application Serial No. 2015-048528 by Examiner Hisashi Yoshida dated Jan. 10, 2017 (9 pages).

Japanese Office Action for Japanese Patent Application No. 2014-541271 dated Jul. 7, 2015.

Search Report from the EPO for Application No. 12 84 7106 by Examiner Michael Stenger, dated Jul. 14, 2015 (3 pages).

International Search Report and Written Opinion dated Mar. 15, 2013, issued in corresponding International Application No. PCT/US2012/064211.

International Search Report and Written Opinion dated Mar. 14, 2013 in corresponding International Application No. PCT/US2012/064086.

Gargas, J., et al., "A Versatile XY Stage with a Flexural Six-Degree-of-Freedom Fine Positioner," *Proc. of the 10th Annual Mtg. of the ASPE* 12 (1995): 203-206.

Kao, Ching-Fen, et al. "Diffractive Laser Encoder with a Grating in Littrow Configuration," *Japanese Journal of Applied Physics* 47.3 (2008): 1833-1837.

Slocum, Alexander H. *Precision Machine Design*. Englewood Cliffs, NJ: Prentice Hall, 1992. 163-174.

Slocum, Alexander H. *Precision Machine Design*. Englewood Cliffs, NJ: Prentice Hall, 1992. 176-206.

Wu, Chyan-Chyi, et al. "Optical heterodyne laser encoder with sub-nanometer resolution," *Measurement Science and Technology* 19.4 (2008): 045305 (8 pages).

* cited by examiner combined measurement and reference hardware (front and back)

Reference path and hardware

Measurement path and hardware

DOUBLE PASS INTERFEROMETRIC ENCODER SYSTEM

CROSS-REFERENCE TO RELATED APPLICATIONS

Under 35 U.S.C. §120, this application is a continuation of and claims benefit to U.S. application Ser. No. 13/671,920, filed on Nov. 8, 2012, which claims priority to U.S. Provisional Application No. 61/557,755, filed on Nov. 9, 2011. The contents of the prior applications are incorporated herein by reference in their entirety.

BACKGROUND

In some cases, interferometric measuring systems monitor changes in the relative position of a measurement object based on an optical interference signal. For example, an interferometer generates the optical interference signal by overlapping and interfering a measurement beam reflected from the measurement object with a second beam, sometimes called a "reference beam," where the measurement beam and the reference beam are derived from a common source. Changes in the relative position of the measurement object correspond to changes in the phase of the measured optical interference signal.

An example of such interferometric measuring systems are interferometric encoder systems, which evaluate the motion of an object by tracking a measuring graduation, called the encoder scale. Typically, an interferometric encoder system includes the encoder scale and an encoder head. The encoder head is an assembly that includes an interferometer. The interferometer directs a measurement beam to the encoder scale, where it diffracts. The interferometer combines the diffracted measurement beam with a reference beam to form an output beam that includes a phase related to the position of the object. Encoder systems are used extensively in lithographic applications for monitoring the motion of moveable stages in a lithography tool. Encoder systems can be advantageous in such applications due to their relative insensitivity to atmospheric turbulence.

SUMMARY

The disclosure relates to double pass interferometric encoder systems and methods, and applications for the double pass interferometric encoder systems and methods.

Various aspects of the invention are summarized as follows.

In general, in a first aspect, the subject matter of the disclosure can be embodied in an encoder system that includes an encoder head for use with a diffractive encoder scale, in which the encoder head includes one or more optical components arranged to: i) direct a first incident beam to the diffractive encoder scale at a first incident angle with respect to a normal to the encoder scale; ii) receive a first return beam from the diffractive encoder scale at a first return angle with respect to the normal to the encoder scale, the first return angle being different from the first incident angle; iii) redirect the first return beam to the diffractive encoder scale as a second incident beam at a second incident angle with respect to the normal to the encoder scale; and iv) receive a second return beam back from the diffractive encoder scale at a second return angle with respect to the normal to the encoder scale, the second return angle being different from the second incident angle, in which a difference between the first incident angle and second incident angle is less than a difference between the first incident angle and the first return angle and less than a difference between the second incident angle and the second return angle.

Implementations of the system can include one or more of the following features and/or features of other aspects. For example, the one or more optical components can be arranged to combine the second return beam with a reference beam to form an output beam, and the encoder system includes a detector positioned to detect the output beam.

The encoder system can further include an electronic processor configured to: receive an interference signal from the detector, the interference signal including a phase related to an optical path difference between the reference beam and the second return beam; and determine information about a degree of freedom of the encoder scale based on the phase. The phase can include a heterodyne phase. The encoder system can further include the diffractive encoder scale. The encoder scale can include a one dimensional or a two dimensional grating.

In some implementations, each of the first return beam and the second return beam includes a diffracted beam. Each diffracted beam can include a first order diffracted beam.

In some implementations, the first incident beam and the first return beam are non-collinear and non-parallel, and the second incident beam and the second return beam are non-collinear and non-parallel.

In some implementations, the one or more optical components include a beam splitting component arranged to receive a source beam from an optical source and to derive the first incident beam from the source beam. Alternatively, or in addition, the beam splitting component is arranged to derive a reference beam from the source beam.

In some implementations, the system can further include a detector.

In some implementations, the one or more optical components include a first reflecting component arranged to: receive the second return beam; and redirect the second return beam to the beam splitting component. The one or more optical components also can include a second reflecting component, the first reflecting component being arranged to redirect the first return beam to the second reflecting component, and the second reflecting component being arranged to: receive the first return beam from the first reflecting component; and redirect the first return beam to the encoder scale as the second incident beam at the second incident angle. The first reflecting component can include a grating, in which the grating is configured to diffract both the first return beam and the second return beam.

In some implementations, the one or more optical components include a first retro-reflector and a first reflecting component, the first reflecting component being arranged to: receive both the first return beam and the second return beam from the encoder scale; and redirect the first return beam and the second return beam to the first retro-reflector, the first retro-reflector being arranged to redirect the second return beam to the beam splitting component. The one or more optical components can also include a second reflecting component, in which the retro-reflector is arranged to redirect the first return beam from the first reflecting component to the second reflecting component. The second reflecting component can be arranged to: receive the first return beam from the first reflecting component; and redirect the first return beam to the measurement object as the second incident beam at the second angle.

In some implementations, the one or more optical components include a first retro-reflector, in which the beam splitting component and the first retro-reflector are arranged in combination to: receive the first return beam; and redirect the first return beam as the second incident beam to the measurement object. The first retro-reflector can be arranged to: receive the reference beam from the beam splitting component; and redirect the reference beam to the beam splitting component. In some implementations, the one or more optical components include multiple prism components between the beam splitting component and the first retro-reflector, in which the multiple prism components are configured to increase a deviation between the first return beam and the reference beam. The multiple prism components can be arranged in a beam path of the reference beam and a beam path of the first return beam. The multiple prism components can include wedge prisms or birefringent prisms.

In some implementations, the system further includes a reference reflector arranged to receive, from the beam splitting component, the reference beam at a first position and at a second position. The reference reflector can include a mirror. The reference reflector can include a surface of the encoder grating. The system can further include a first quarter wave-plate, the first quarter wave-plate being arranged between the reference reflector and the beam splitting component.

In some implementations, the encoder system further includes a second quarter wave-plate, the second quarter wave-plate being arranged between the encoder grating and the beam splitting component.

In certain implementations, the one or more optical components include a beam combiner arranged to: receive the second return beam from the encoder scale; receive the reference beam from the beam splitting component; and combine the second return beam with the reference beam to form the output beam. The one or more optical components can include a prism pair and a retroreflector. The prism pair and the retro reflector can be arranged in combination to redirect the first return beam to the measurement object as the second incident beam.

In some implementations, the one or more optical components include a single optical component.

In some implementations, the encoder system can be coupled to an illumination system, in which the illumination system includes: a radiation source, where during operation of the lithography system, the source directs radiation to the encoder system; a detector to detect, during operation of the lithography system, an output beam from the encoder system; an electronic processor configured to receive an interference signal from the detector, the interference signal comprising a phase related to an optical path difference, and to determine information about displacement of the encoder scale based on the phase; and a positioning system coupled to the electronic processor and configured to adjust the position of the stage based on the information about the displacement of the encoder scale.

In certain aspects, the subject matter of the present disclosure can be embodied in a system that includes a moveable stage, and an encoder system. Either a diffractive encoder scale or a measurement object can be attached to the moveable stage. The encoder system can include an encoder head for use with the diffractive encoder scale, in which the encoder head includes one or more optical components arranged to: direct a first incident beam to the diffractive encoder scale at a first incident angle with respect to a normal to the encoder scale; receive a first return beam from the diffractive encoder scale at a first return angle with respect to the normal to the encoder scale, the first return angle being different from the first incident angle; redirect the first return beam to the diffractive encoder scale as a second incident beam at a second incident angle with respect to the normal to the encoder scale; and receive a second return beam back from the diffractive encoder scale at a second return angle with respect to the normal to the encoder scale, the second return angle being different from the second incident angle, in which a difference between the first incident angle and second incident angle is less than either a difference between the first incident angle and the first return angle or a difference between the second incident angle and the second return angle.

In certain aspects, the subject matter of the present disclosure can be embodied in a lithography system that includes a moveable stage and encoder system, in which either a diffractive encoder scale or a measurement object can be attached to the moveable stage. The lithography system can further include an illumination system coupled to the encoder system, in which the illumination system has a radiation source, such that during operation of the lithography system, the source directs radiation to the encoder system. The lithography system can further include a detector to detect, during operation of the lithography system, an output beam from the encoder system, and an electronic processor configured to receive an interference signal from the detector, the interference signal comprising a phase related to an optical path difference, and to determine information about displacement of the encoder scale based on the phase. The lithography system can further include a positioning system coupled to the electronic processor and configured to adjust the position of the stage based on the information about the displacement of the encoder scale.

The details of one or more embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION

Figure 1:
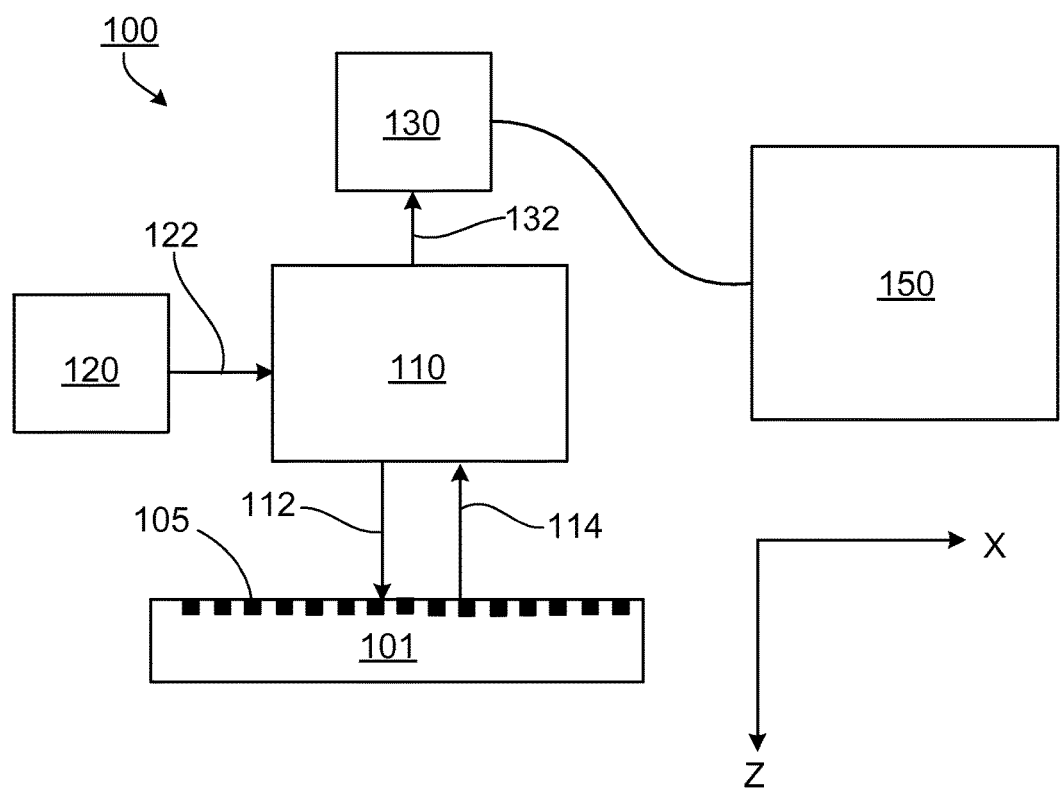
FIG. 1 is a schematic of an example interferometric encoder system.

Referring to FIG. 1, an interferometric encoder system 100 includes a light source module 120 (e.g., including a laser), an optical assembly 110, a measurement object 101, a detector module 130 (e.g., including a polarizer and a detector), and an electronic processor 150. Generally, light source module 120 includes a light source and can also include other components such as beam shaping optics (e.g., light collimating optics), light guiding components (e.g., fiber optic waveguides) and/or polarization management optics (e.g., polarizers and/or wave plates). Various embodiments of optical assembly 110 are described below. In some implementations, the optical assembly may also be referred to as the "encoder head." A Cartesian coordinate system is shown for reference, in which the Y-axis (not shown) extends into the page.

Measurement object 101 is positioned some nominal distance from optical assembly 110 along the Z-axis. In many applications, such as where the encoder system is used to monitor the position of a wafer stage or reticle stage in a lithography tool, measurement object 101 is moved relative to the optical assembly 110 in the x- and/or y-directions while remaining nominally a constant distance from the optical assembly relative to the z-axis. This constant distance can be relatively small (e.g., a few centimeters or less). However, in such applications, the location of measurement object typically will vary a small amount from the nominally constant distance and the relative orientation of the measurement object within the Cartesian coordinate system can vary by small amounts too. During operation, encoder system 100 monitors one or more of these degrees of freedom of measurement object 101 with respect to optical assembly 110, including a position of measurement object 101 with respect to the x-axis, and further including, in certain embodiments, a position of the measurement object 101 with respect to the y-axis and/or z-axis and/or with respect to pitch and yaw angular orientations.

To monitor the position of measurement object 101, source module 120 directs an input beam 122 to optical assembly 110. Optical assembly 110 derives a measurement beam 112 from input beam 122 and directs measurement beam 112 to measurement object 101. Optical assembly 110 also derives a reference beam (not shown) from input beam 122 and directs the reference beam along a path different from the measurement beam. For example, optical assembly 110 can include a beam splitter that splits input beam 122 into measurement beam 112 and the reference beam. The measurement and reference beams can have orthogonal polarizations (e.g., orthogonal linear polarizations).

Measurement object 101 includes an encoder scale 105, which is a measuring graduation that diffracts the measurement beam from the encoder head into one or more diffracted orders. In general, encoder scales can include a variety of different diffractive structures such as gratings or holographic diffractive structures. Examples of gratings include sinusoidal, rectangular, or saw-tooth gratings. Gratings can be characterized by a periodic structure having a constant pitch, but also by more complex periodic structures (e.g., chirped gratings). In general, the encoder scale can diffract the measurement beam into more than one plane. For example, the encoder scale can be a two-dimensional grating that diffracts the measurement beam into diffracted orders in the x-z and y-z planes. The encoder scale extends in the x-y plane over distances that correspond to the range of the motion of measurement object 110.

In the present embodiment, encoder scale 105 is a grating having grating lines that extend orthogonal to the plane of the page, parallel to the y-axis of the Cartesian coordinate system of FIG. 1. The grating lines are periodic along the x-axis. Encoder scale 105 has a grating plane corresponding to the x-y plane and the encoder scale diffracts measurement beam 112 into one or more diffracted orders in the y-z plane.

At least one of these diffracted orders of the measurement beam (labeled beam 114), returns to optical assembly 110, where it is combined with the reference beam to form an output beam 132. For example, the once-diffracted measurement beam 114 can be the first-order diffracted beam.

Output beam 132 includes phase information related to the optical path length difference between the measurement beam and the reference beam. Optical assembly 110 directs output beam 132 to detector module 130 that detects the output beam and sends a signal to electronic processor 150 in response to the detected output beam. Electronic processor 150 receives and analyzes the signal and determines information about one or more degrees of freedom of measurement object 101 relative to optical assembly 110.

In certain embodiments, the measurement and reference beams have a small difference in frequency (e.g., a difference in the kHz to MHz range) to produce an interferometry signal of interest at a frequency generally corresponding to this frequency difference. This frequency is hereinafter referred to interchangeably as the "heterodyne" frequency. Information about the changes in the relative position of the measurement object generally corresponds to a phase of the interferometry signal at this heterodyne frequency. Signal processing techniques can be used to extract this phase. In general, the moveable measurement object causes this phase term to be time-varying. In this regard, the first order time derivative of the measurement object movement causes the frequency of the interferometry signal to shift from the heterodyne frequency by an amount referred to herein as the "Doppler" shift.

The different frequencies of the measurement and reference beams can be produced, for example, by laser Zeeman splitting, by acousto-optical modulation, using two different laser modes, or internal to the laser using birefringent elements, among other techniques. The orthogonal polarizations allow a polarizing beam-splitter to direct the measurement and reference beams along different paths, and combine them to form the output beam that subsequently passes through a polarizer, which mixes the orthogonally polarized components so they can interfere. In the absence of target motion, the interference signal oscillates at the heterodyne frequency, which is just the difference in the optical frequencies of the two components. In the presence of target motion, the heterodyne frequency incurs a change related to the velocity of the target through well-known Doppler relations. Accordingly, monitoring changes in the heterodyne frequency allows one to monitor motion of the target relative to the optical assembly.

In the embodiments described below, the "input beam" generally, refers to the beam emitted by the light source module. For heterodyne detection, the input beam includes components having slightly different frequencies, as discussed above.

In certain embodiments, the interferometer systems are designed so they do not operate at Littrow. For example, in general, the measurement beam is incident on measurement object 101 at an incident angle such that the once-diffracted measurement beam does not satisfy the Littrow condition. The Littrow condition refers to an orientation of a diffractive structure, such as a grating, with respect to an incident beam where the diffractive structure directs the diffracted beam back towards the source. In other words, in encoder system 100, the once-diffracted measurement beam does not satisfy the Littrow condition because the once-diffracted measurement beam is non-co-linear with the measurement beam that is incident on the encoder scale.

While encoder scale 105 is depicted in FIG. 1 as a structure that is periodic in one direction, more generally, the measurement object can include a variety of different diffractive structures that appropriately diffract the measurement beam. In some embodiments, the measurement object can include a diffractive structure (e.g., a encoder scale) that is periodic in two directions (e.g., along the x- and y-axis), diffracting the measurement beam into beams in two orthogonal planes. In general, the diffractive structure of the encoder scale and source module are selected so that the encoder system provides one or more diffracted measurement beams having sufficient intensity to establish one or more detectable interference signals when combined with corresponding reference beams, within the geometrical constraints for the system. In some embodiments, the source module provides an input beam having a wavelength in a range from 400 nm to 1,500 nm. For example, the input beam can have a wavelength of about 633 nm or about 980 nm. Note that, in general, the frequency splitting of the heterodyne source results in only a very small difference between the wavelength of the two components of the input beam, so even though the input beam is not strictly monochromatic it remains practical to characterize the input beam by a single wavelength. In some embodiments, the source module can include a gas laser (e.g., a HeNe laser), a laser diode or other solid-state laser source, a light-emitting diode, or a thermal source such as a halogen light with or without a filter to modify the spectral bandwidth.

In general, the diffractive structure (e.g., grating pitch) can vary depending on the wavelength of the input beam and the arrangement of optical assembly and diffracted orders used for the measurement. In some embodiments, the diffractive structure is a grating having a pitch in a range from about $1\lambda$ to about $20\lambda$, where $\lambda$ is a wavelength of the source. The grating can have a pitch in a range from about 1 µm to about 10 µm.

In some cases, optical errors can be introduced into the interferometric encoder system through a process typically referred to as beam mixing, in which "ghost" beams interfere with the measurement and/or reference beams. These ghost beams may have different amplitudes, different phase offsets, and/or difference frequencies from the beams with which they combine, resulting in a shift in a detected phase of the interferometry signal. Accordingly, measurements of the relative position of the encoder scale may deviate from the encoder scale's actual position, thus limiting the accuracy of displacement changes measured by the interferometer.

Such ghost beams can be caused by various imperfections in the interferometric encoder system. For example, if the measurement and reference beams have difference frequencies, ellipticity in the polarizations of the different frequency components of those beams may lead to unwanted leakage of the reference and/or measurement beams through one or more optical components of in the interferometric encoder system. Unwanted leakage of the reference and/or measurement beams can also be caused by imperfections in an optical component, itself. For example, the interferometric encoder system may include a polarizing beam splitter in which the beam splitter has a low extinction ratio, such that unwanted beam components are transmitted instead of being reflected by the beam splitter and vice versa. Ghost beams also can arise due to unwanted reflections from other components of the interferometric encoder system. For example, in some implementations, a portion of a beam incident on the encoder scale is diffracted back along the incident direction instead of being diffracted along a path that is non-colinear with the input beam.

Other optical errors also can occur in the interferometric encoder system due to the occurrence of beam shearing. Beam shear arises when the relative position of the encoder grating with respect to the encoder head increases or decreases (e.g., caused by movement of the encoder scale and/or the encoder head along the z-direction in FIG. 1). In some cases, this motion can cause the beam paths of the measurement beam and reference beam to diverge, leading to further measurement errors of the encoder scale position. Similar errors can arise due to small changes in orientation of the encoder scale with respect to the encoder head including, for example, changes in the tip, tilt and yaw of the encoder scale.

To improve the tolerance for the aforementioned errors, an interferometric encoder system can be configured such that the measurement beam makes a double pass to the encoder scale such that the measurement beam is twice diffracted from the encoder scale. By configuring the system to produce large angle differences between the incident beams and the corresponding diffracted beams, interference from ghost beams and other spurious beams can be reduced. In some implementations, the double pass arrangement for the interferometric encoder system also can compensate for beam shear that may occur when the relative distance between the encoder scale and the encoder head changes. Additionally, the double pass configuration has, in some implementations, the advantage of compensating, to a first order, small changes in the orientation of the object, such as tip, tilt and yaw.

Figure 2:
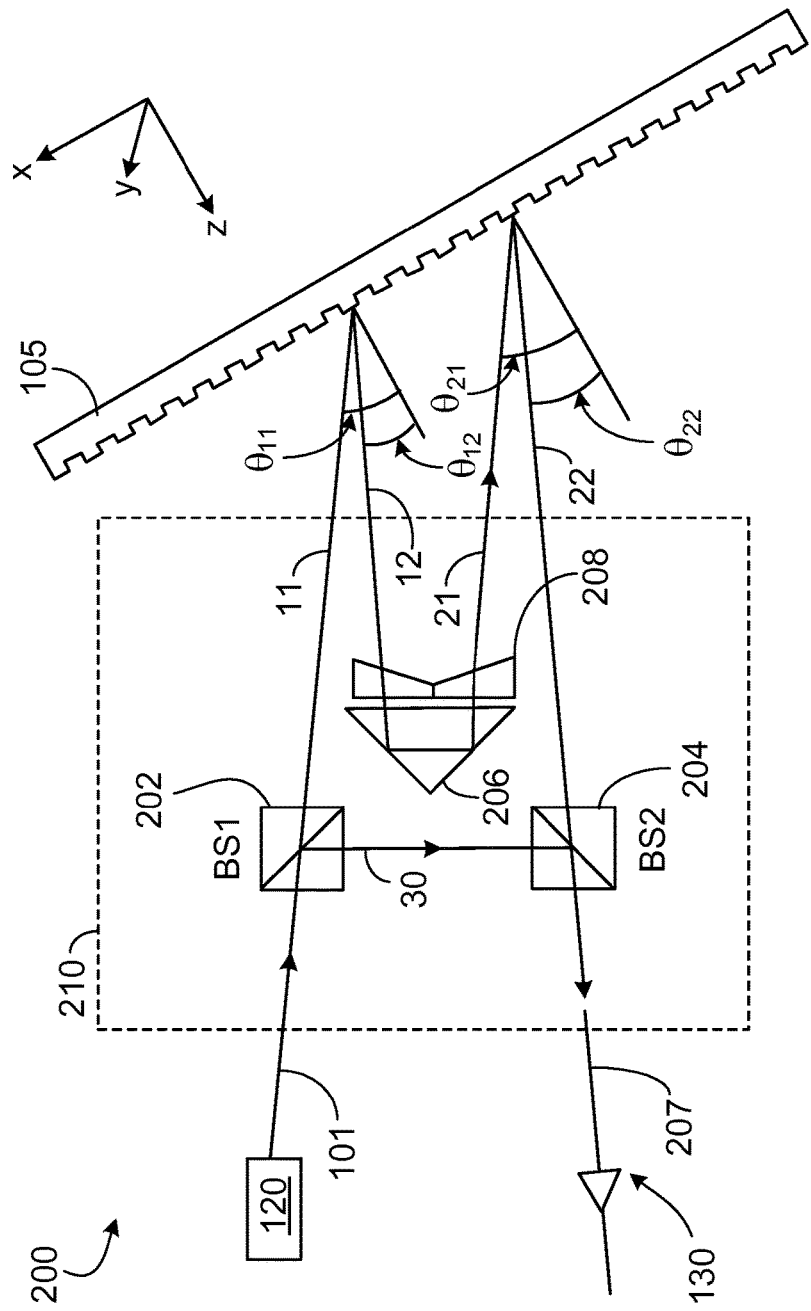
FIGS. 2-10 are schematics of example double pass interferometric encoder systems.

FIG. 2 is a schematic of an example of encoder head 210 of a double pass interferometric encoder system 200 for monitoring the position of a measurement object 105, in which the encoder head 210 is configured such that a measurement beam makes two passes to a measurement object 105 and a single diffracted beam returning from the measurement object 105 is used in combination with a reference beam to determine a position of the measurement object 105. In the present example, the measurement object 105 is an encoder scale, such as a one-dimensional grating. The encoder scale 105 can be attached to another object including, for example, a moveable stage.

The encoder system 200 is configured to detect displacements along the z coordinate and along the x coordinate, where z is orthogonal to the grating surface and x is in the plane of the grating surface and orthogonal to the grating grooves shown. The encoder head 210 includes a first beam splitter 202, a second beam splitter (beam combiner) 204, a retro-reflector 206, and a prism pair 208. During operation of the encoder system 200, the encoder head 210 receives a source beam 101 from an optical source 120. The first beam splitter 202 divides the source beam into a measurement beam and a reference beam 30, which are then directed along different paths. As shown in FIG. 2, the measurement beam includes four different portions: a first incident beam 11, a first return beam 12, a second incident beam 21, and a second return beam 22. Because the measurement object 105 is an encoder scale, the first return beam 12 corresponds to a diffracted order (e.g., first order or second order) of the first incident beam 11.

The first return beam 12 is redirected by the combination of the retro-reflector 206 and prism pair 208 to return to the encoder scale 105 as the second incident beam 21, where the measurement beam is again diffracted to produce the second return beam 22. The second return beam 22 corresponds to a diffracted order (e.g., first order or second order) of the second incident beam 12. The beam splitter 204 then recombines the reference beam 30 and the second return beam 22 to form an output beam 207 that is directed toward detector. An interference signal formed at detector 130 then is passed to an electronic processor that determines position information about the encoder scale 105 based on the interference signal.

The source beam can be generated from a heterodyne source, such as a heterodyne laser, in which the source beam comprises two separate beams propagating with slightly different frequencies encoded by orthogonal polarizations. Beam splitter 202 can be a polarizing beam splitter that separates the two frequencies based on their different polarizations. Upon recombination of the reference beam 203 and the second return beam 22 at beam combiner 204, the output beam 207 propagates to a detector module 130. A sinusoidal signal is obtained from a beat frequency of the detected output beam 207, in which the phase of the signal is $\phi_m - \phi_r$, where $\phi_r$ is the reference phase, presumed stable or known, and $\phi_m$ is the measurement phase.

Assuming that the plane of incidence for the first and second incident beams contains the x coordinate and defining angles with respect to the z coordinate shown, the angles at which the beams 11, 12, 21, 22 propagate with respect to a normal of the encoder scale 105 are $\theta_{11}$, $\theta_{12}$, $\theta_{21}$, $\theta_{22}$, respectively. The angle $\theta_{22}$ for second return beam 22 is shown in FIG. 2 as an example. Because the measurement object 105 diffracts the incident beams, the following well-known grating relationships apply:

$$\sin(\theta_{11}) + \sin(\theta_{12}) = m\lambda/D \quad (1)$$

$$\sin(\theta_{21}) + \sin(\theta_{22}) = m\lambda/D \quad (2)$$

where m is an integer known as the diffraction order and D is the grating pitch or spacing between the lines or repeated features of the encoder scale 105. As is evident from the figure, the following additional inequalities apply. The first return beam 12 is neither collinear nor parallel to the first incident beam 11:

$$\theta_{12} \neq \theta_{11} \quad (3)$$

The second return beam 22 is neither collinear nor parallel to the second incident beam 21:

$$\theta_{22} \neq \theta_{21} \quad (4)$$

A further basic characteristic of the configuration shown in FIG. 2 is that the difference between the angle of propagation of the first incident beam 11 and the angle of propagation of the second incident beam 21 is smaller than the difference between the angle of propagation of the first incident beam 11 and first return beam 12:

$$|\theta_{11} - \theta_{21}| < |\theta_{11} - \theta_{12}|; \quad (5)$$

and the difference between the angle of propagation of the first incident beam 11 and the angle of propagation of the second incident beam 21 is smaller than the difference between the angle of propagation of the second incident beam 21 and the angle of propagation of the second return beam 22:

$$|\theta_{11} - \theta_{21}| < |\theta_{21} - \theta_{22}|. \quad (6)$$

Similarly, the difference between the angle of propagation of the first return beam 12 and the angle of propagation of the second return beam 22 is smaller than the difference between the angle of propagation of the first incident beam 11 and first return beam 12:

$$|\theta_{12} - \theta_{22}| < |\theta_{11} - \theta_{12}|. \quad (7)$$

The difference between the angle of propagation of the first return beam 12 and the angle of propagation of the second return beam 22 is smaller than the difference between the angle of propagation of the second incident beam 21 and second return beam 22:

$$|\theta_{12} - \theta_{22}| < |\theta_{21} - \theta_{22}|. \quad (8)$$

The magnitudes of the inequalities in equations (3) through (8) are large enough such that the beams are not obstructed by the optical components. For example, beam 11 shown in FIG. 2 is not blocked by retroreflective prism 206. In the present example, the two incident beams 11 and 21 are approximately parallel, whereas the two reflected beams 12 and 22 are approximately parallel:

$$\theta_{11} \approx \theta_{21} \quad (9)$$

$$\theta_{12} \approx \theta_{22}. \quad (10)$$

In contrast, for the present example, neither incident beam is parallel to the corresponding reflected beam, as indicated in equations (3) and (4).

In some implementations, the differences in angles between the incident and return beams are large enough to reduce the measurement errors caused by contamination of the final interference signal from ghost reflections and other spurious beams. For example, in some implementations, the optical components of the encoder head 210 are arranged such that the inequalities in equations (5) through (8) are larger than about 1 mrad for 1 mm beam diameters. In some cases, proportionally larger angles can be used for smaller beam diameters.

The double pass interferometric encoder system can be sensitive to the displacement of the encoder scale 105 along two orthogonal directions. For example, an in-plane displacement of the encoder scale 105 along the x coordinate changes the phase $\Phi_m$ of the measurement beam after two reflections from the encoder (e.g., the second return beam 22) at a rate that can be expressed as $$\phi_m = (4\pi m/D)\Delta x, \quad (11)$$

where $\Delta x$ is the displacement of the encoder scale 105 along the x direction. Similarly, an out of plane displacement of the encoder scale 105 along the z coordinate is given by $$\phi_m = 4\pi \Delta z \sqrt{1 - (m\lambda/D)^2}, \quad (12)$$

where $\Delta z$ is the displacement of the encoder scale 105 along the z direction. Equations (11) and (12) also can apply for movement of the encoder head 210 relative to the encoder scale 105. Accordingly, once the electronic processor has evaluated the phase information from the detected interference signal, equations (11) and (12) can be used to determine the motion of the encoder head 210 or encoder scale 105 in x or in z directions. For example, as would be appreciated by one of ordinary skill in the art, the electronic processor can calculate the measurement phase $\phi_m$ by subtracting the known reference phase $\phi_r$ from the phase information of the detected signal, and then calculate the displacement in the x or z direction using equations (11) and (12).

For applications in which either the encoder scale and/or encoder head move along two orthogonal directions (e.g., along the x and z directions), the encoder head 210 can be modified to extract position information along each of the different orthogonal directions of movement, separately. For example, in some implementations, the encoder head 210 is expanded to include a second set of the optical components shown in FIG. 2 (e.g., beam splitter 202, beam splitter 204, retro-reflector 206, and prism pair 208). The second set of optical components is configured to derive a second measurement beam from the source beam, such that the second measurement beam makes another two passes to the surface of the encoder scale. In contrast to the first measurement beam, however, the angle at which the second measurement beam is initially incident on the encoder scale 105 is different from the angle of incidence for beam 11, e.g., the second measurement beam can be initially incident at an angle corresponding to $-\theta_{11}$ with respect to a normal of the encoder scale surface. To distinguish from the x direction and they direction, at least two measurements at two different angles are used. The different angles can include, but are not limited to, angles that are equal in magnitude but in opposite directions. The phase dependency on $\Delta x$ in equation (11) is thus reversed for the second measurement beam but the phase dependency on z in equation (12) remains the same. Accordingly, the difference between the two results provided by equation (11) for the first and second measurement beams can be used to extract the x displacement independent of z. Alternatively or in addition, the sum of the two results provided by equation (12) for the first and second measurement beams can be used to extract the z displacement independent of x.

The inequalities referred to in the equations above with respect to the system of FIG. 2 also apply to the additional embodiments described below. In particular, the interferometric encoder systems are configured to preclude both the return beam angles 12 and 22 from being exactly at the Littrow condition. Thus, at least some angular separation is introduced between the beams, which can help to reduce position measurement errors caused by interference from ghost reflections. In some embodiments, the encoder head can be configured to enhance a separation between the reference beam path and the measurement beam path in the optical components. Increasing the separation between beam paths can reduce the possibility of spurious beams contributing significantly to the interference signal.

Figure 3:
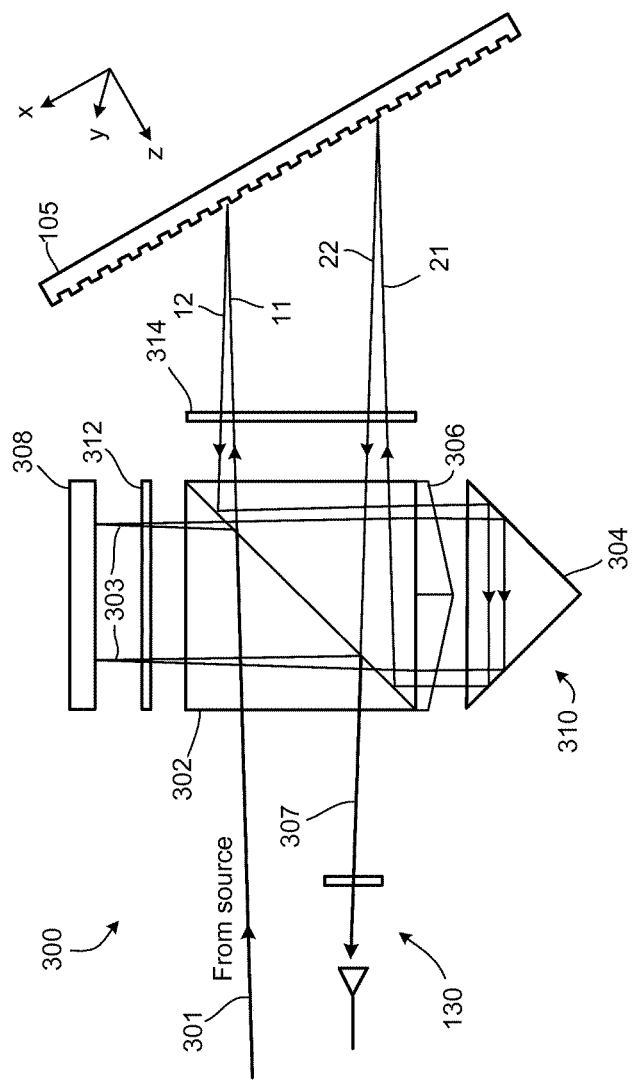

For example, FIG. 3 is a schematic of a double pass interferometric encoder system 300 including an encoder head 310 for monitoring the position of a measurement object 105, in which the encoder head 310 is configured to increase the separation between a reference beam path and a measurement beam path. The encoder head 310 includes a polarization beam splitter 302, a retro-reflector 304, a pair of wedge prisms 306 and a reference reflector 308. The encoder head 310 also can include a first quarter wave-plate 312 between the reference reflector 308 and the beam splitter 302, and a second quarter wave-plate 314 between the measurement object 105 (e.g., an encoder scale) and the beam splitter 302. The wedge prisms 306 introduce into the system 300 the inequalities according to equations (3) through (8). In certain implementations, the configuration of encoder head 310 has the advantages of high thermal stability and ease of use for managing large beams.

As shown in the example of FIG. 3, the encoder head 310 receives a source beam 301 from a source 120. The beam splitter 302 derives a reference beam 303 and a measurement beam from the source beam 301 (e.g., based on differences in polarization of different frequency components of the source beam). The measurement beam includes four different portions: a first incident beam 11, a first return beam 12, a second incident beam 21, and a second return beam 22. The beam splitter 302 directs the first incident beam 11 through the second quarter wave-plate 314 to the encoder scale 105, where the first incident beam 11 is diffracted to produce first return beam 12. The first return beam 12 is redirected by the combination of the beam splitter 302 and the retro-reflector 304 back to the encoder scale 105 as a second incident beam 21, where the second incident beam 21 then is diffracted to produce second return beam 22.

The beam splitter 302 also redirects the reference beam 303 toward the reference reflector 308. The reference reflector 308 can include any suitable reflecting surface such as, for example, a mirror. In some implementations, the position of the reflector 308 is adjustable. For example, in some cases, the reflector 308 can be attached to a moveable stage. The reference reflector 308 reflects the reference beam 303 back to the beam splitter 302, where the beam 303 is redirected by the combination of beam splitter 302 and retro-reflector 304 back again to the reference reflector 308. The reference reflector 308 reflects the reference beam 303 a second time to the beam splitter 302. Instead of passing through the beam splitter 302, the twice-reflected reference beam 303 then is combined with the second return beam 22 to form an output beam 307. Output beam 307 is recorded by a detector module 130 that includes a detector (e.g., photodetector) and a mixing polarizer. The beam separation is accomplished based on the different polarization of the incident beams. For example, beam 301 has an s-polarization component that reflects towards the reference mirror 308 and a p polarization component that transmits as a measurement beam towards the grating 105. After two passes through the quarter waveplate 314, the polarizations are reversed so that the reference beam is transmitted and the measurement beam is reflected.

Figure 4:
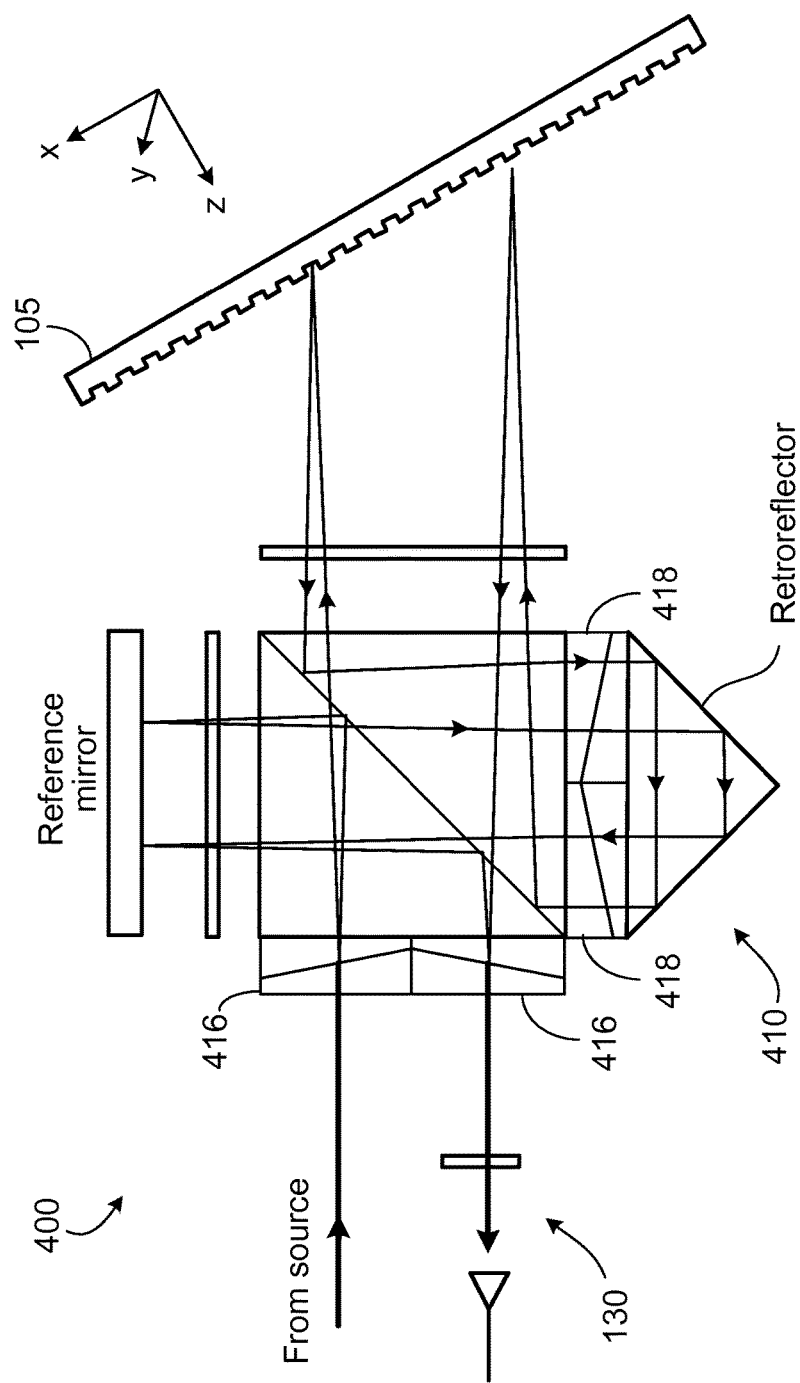

FIG. 4 is a schematic of another example double pass interferometric encoder system 400 including an encoder head 410. The arrangement of the encoder head 410 is similar to the encoder head 310 shown in FIG. 3, except that in the place of the wedge prism, encoder head 410 includes a first birefringent prism pair 416 and a second birefringent prism pair 418. The addition of the birefringent prism pairs cause additional deviation/separation between the measurement and reference beam paths through the encoder 410.

Figure 5:
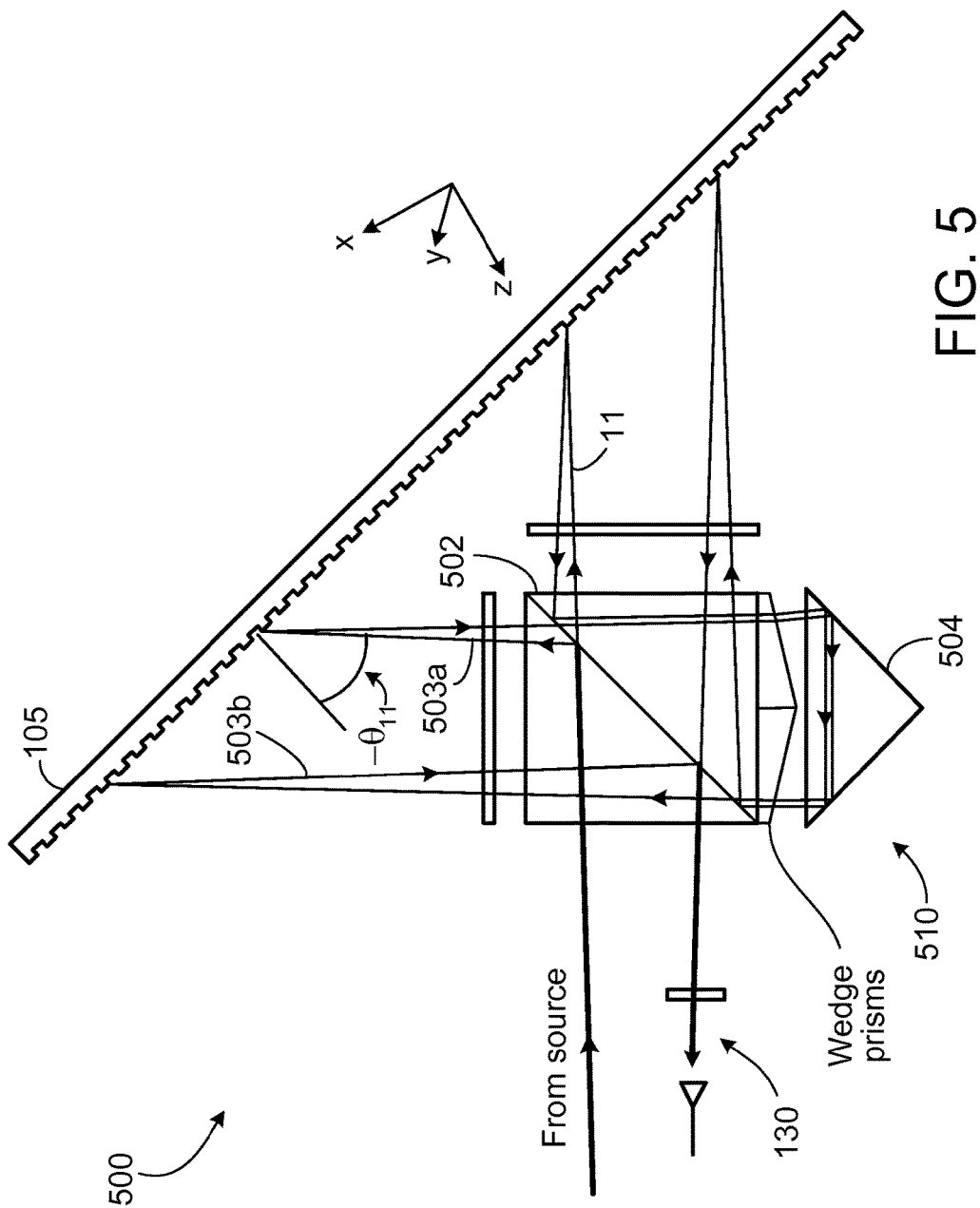

In some embodiments, the encoder head can be designed to measure a first direction of motion independent of a second orthogonal direction of motion. For example, FIG. 5 shows a schematic of a double pass interferometric encoder system 500 that includes an encoder head 510 configured to measure displacement of the encoder scale 105 in the x direction independent of the z direction. The configuration of the encoder head 510 is similar to the example shown in FIG. 3. In contrast to the example of FIG. 3, however, the encoder head 510 is configured such that a reference beam 503 is incident on a portion of the encoder scale surface instead of a reference reflector. That is, the beam splitter 502 is positioned with respect to the encoder scale so that the incident reference beam 503a exiting beam splitter 502 travels along a beam path toward the encoder scale 105. The incident reference beam 503 then is diffracted by encoder scale to produce a diffracted reference beam having a diffraction order (e.g., first order or second order) that propagates to the beam splitter 502. The combination of beam splitter 502 and retro-reflector 504 redirect the once-diffracted beam back toward the encoder scale 105, where the once-diffracted beam is diffracted again. The twice-diffracted reference beam 503b then returns to the beam splitter 502 and is combined with a twice-diffracted measurement beam to produce the output beam.

When the reference beam 503 is incident on the encoder scale 105 at angle with respect to a normal of the encoder surface corresponding to $-\theta_{11}$ (negative of the angle at which incident measurement beam 11 impacts the encoder scale), the configuration shown in the example of FIG. 5 can be used to determine the displacement of the encoder scale 105 along the x direction independently of the z direction. For example, equation (11) can be used to calculate the phase dependency on $\Delta x$ for both the twice-diffracted reference beam and the twice-diffracted measurement beam. The difference between the two results provided by equation (11) for the reference and measurement beams then can be used to extract the x displacement independent of z absent tilt about the y axis.

In general, the difference in angles between the incident beams and corresponding diffracted beams in the embodiments illustrated in FIGS. 2-5 can include, but are not limited to, angles in the range of between about 1 and about 10 degrees. In some implementations, the difference in angles can be less. For example, referring to FIG. 3, the difference in angles can be between about 1 mrad and about 10 mrad. In some embodiments, the encoder head can be configured to produce large differences in angles between incident beams and diffracted beams. For instance, FIG. 6 is a schematic of an example double pass interferometric encoder system 600, in which the angles between an incident measurement beam and a corresponding diffracted beam can be on the order o about 10 degrees to about 80 degrees.

The encoder head 610 includes a beam splitter 602 to derive a reference beam and a first incident measurement beam 11 from a source beam 601. The first incident beam 11 propagates toward the encoder scale 105 and is diffracted to produce a first diffracted return beam 12. The return beam 12 is reflected by a first reflecting component 604 towards a second reflecting component 606. The second reflecting component 606 then redirects the first return beam 12 toward the encoder scale 105 as a second incident beam 21. The second incident beam 21 is diffracted by the encoder scale 105 to produce a second return beam 22, in which the second return beam 22 corresponds to a twice-diffracted measurement beam. The second return beam 22 then is redirected by first reflecting component 604 towards the beam splitter/combiner 602 and combined with the reference beam to produce an output beam 605 that passes to a detector module 130 (e.g., including a polarizer and a detector). The first reflecting component 604 and second reflecting component 606 can include any suitable highly reflective component such as, for example, a mirror.

Figure 6:
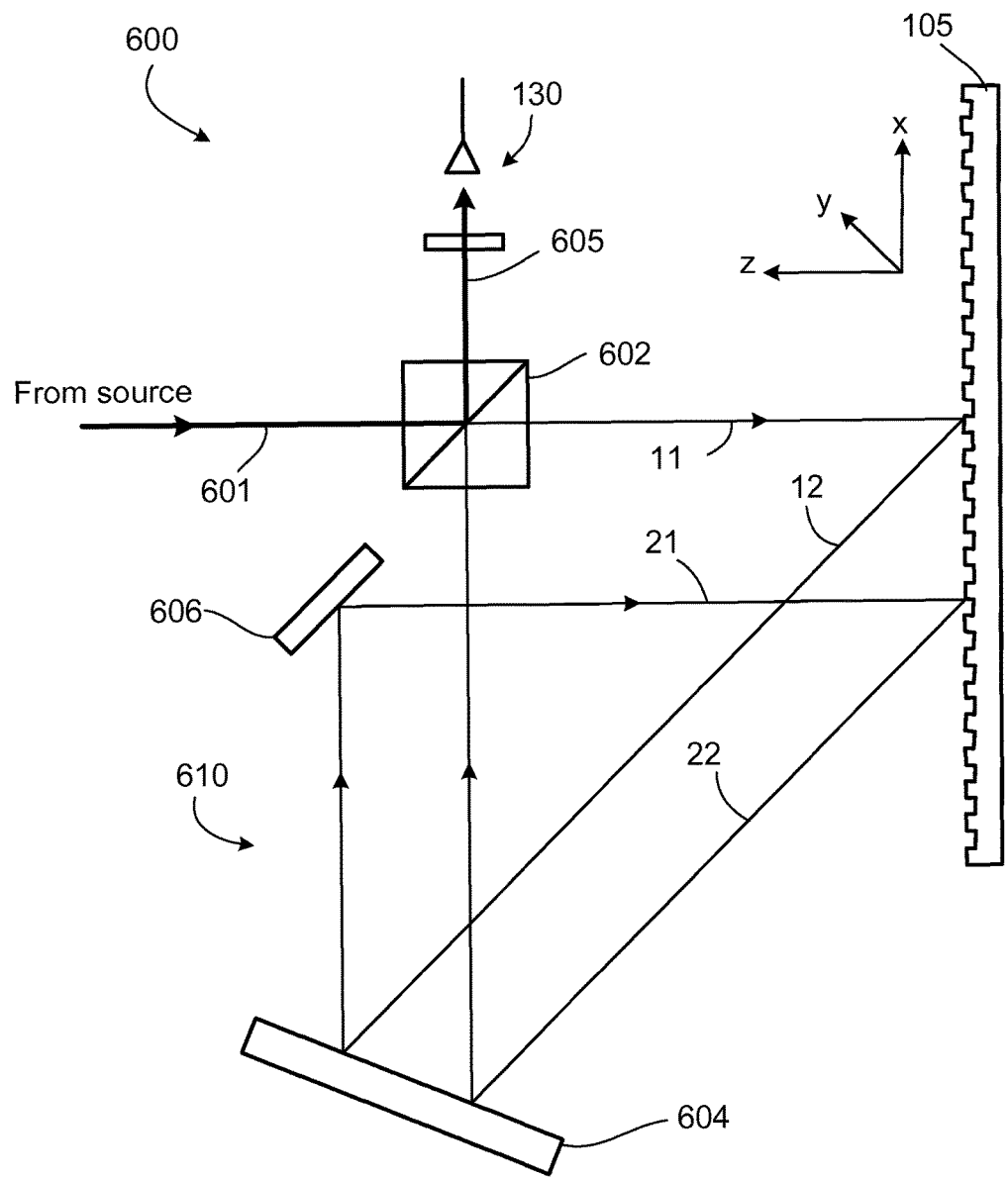

For the purpose of illustration, diffraction of the incident beam is shown in FIG. 6 only within the plane of the figure. The system 600 can be configured, however, to also redirect beams that diffract along directions into or out of the plane of the figure for full 3D retro-reflection and thus further reduce the system's sensitivity to object tilt. Similar to the embodiments disclosed in FIGS. 2-5, the system 600 can be used to compensate for lateral beam shear at the detector, in which the beam shear is caused by relative changes in position of the encoder head 610 or encoder scale 105 along directions parallel to the z direction.

Figure 7:
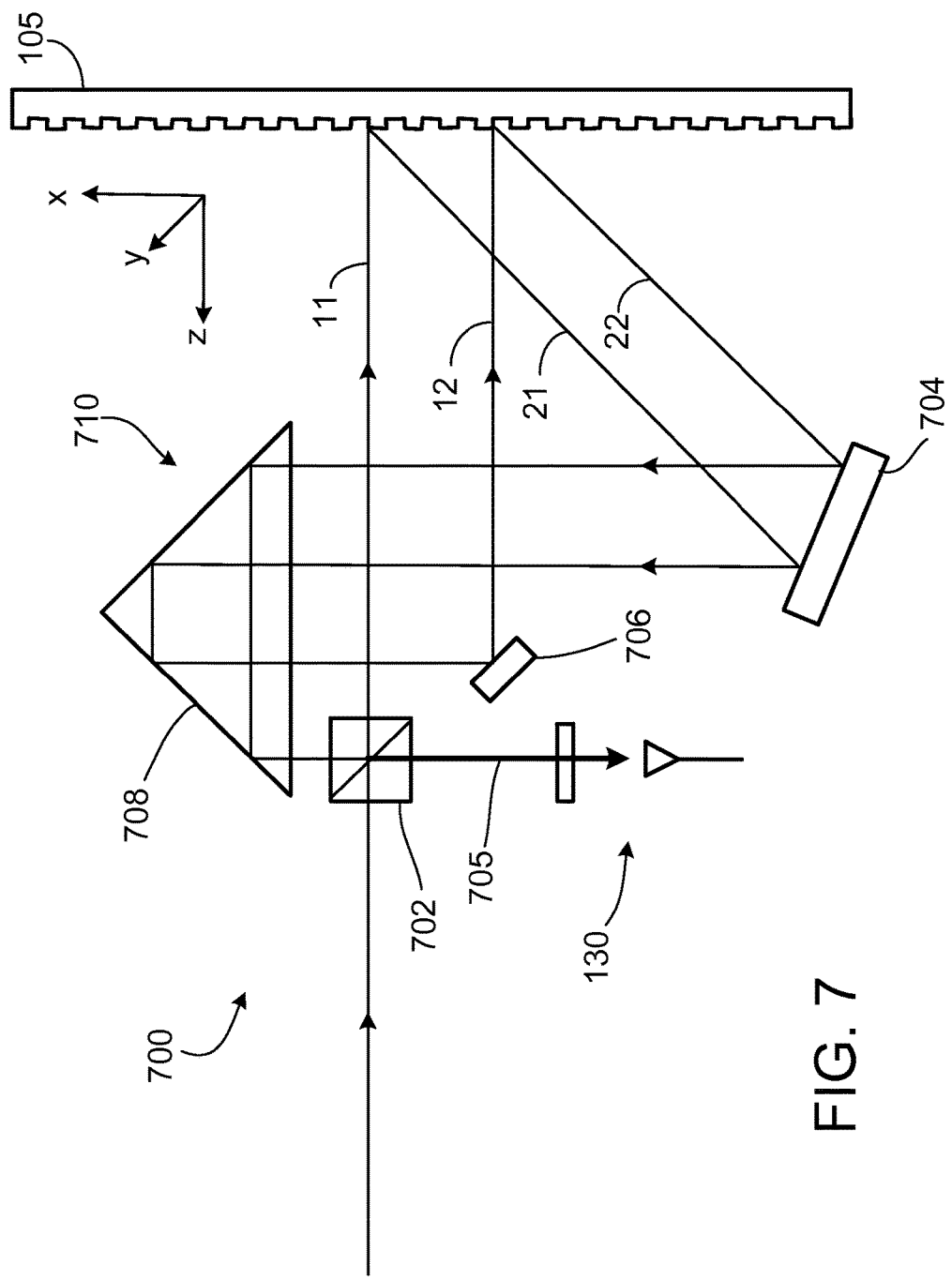

FIG. 7 is a schematic of an example double pass interferometric encoder system 700 that is a variation of the arrangement shown in FIG. 6. In particular, the encoder head 710 of system 700 includes a retro-reflector 708 in addition to the first reflective component 704, the second reflective component 706, and the beam-splitter/beam-combiner 702. The retro-reflector 708 is operable to receive a first return beam 12 from the first reflective component 704 and redirect the beam 12 to the second reflective component 706, which, in turn, is operable to direct the beam 12 toward encoder scale 105. The retro-reflector 708 also is operable to redirect a second return beam 22 toward the beam splitter 702 where the second return beam 22 is combined at beam-splitter/beam-combiner 702 with a reference beam to form an output beam 705.

Figure 8:
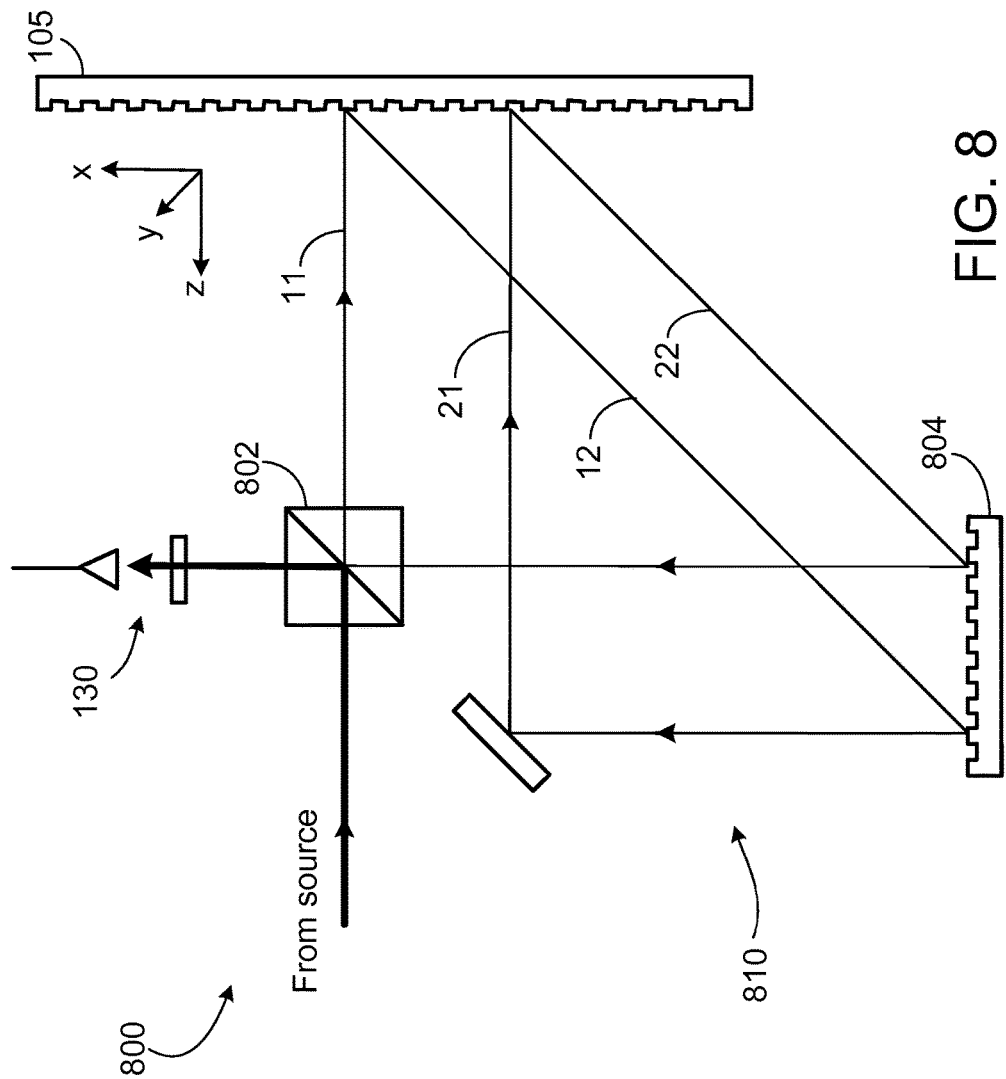

FIG. 8 is a schematic of an example double pass interferometric encoder system 800 that is another variation of the arrangement shown in FIG. 6. In particular, the first reflecting component 804 includes a diffracting component such as, for example, a diffraction grating. Accordingly, the measurement beam which is combined with the reference beam at the beam-splitter/beam-combiner 802 corresponds to a beam that has been diffracted four different times, including twice by the encode scale 105 and twice by the diffracting component 804. In certain implementations, the encoder head configuration shown in FIG. 8 is capable of improving the compensation for grating tilts compared to the encoder head configuration of the system 600 shown in FIG. 6. In particular, the encoder head 810 compensates for the nonlinear diffraction angle behavior of the encoder scale 105. As would be understood by one of ordinary skill, if there is a small change in the angle of incident beam 11, the change in the angle of the reflected beam 12 calculated from Eq. (1) will not be the same as the change in the angle of incident beam 11. However, by placing the diffracting component 804 as shown, this difference in angle changes is compensated, and beam 21 remains parallel to beam 11, as in Eq. (9).

Figure 9:
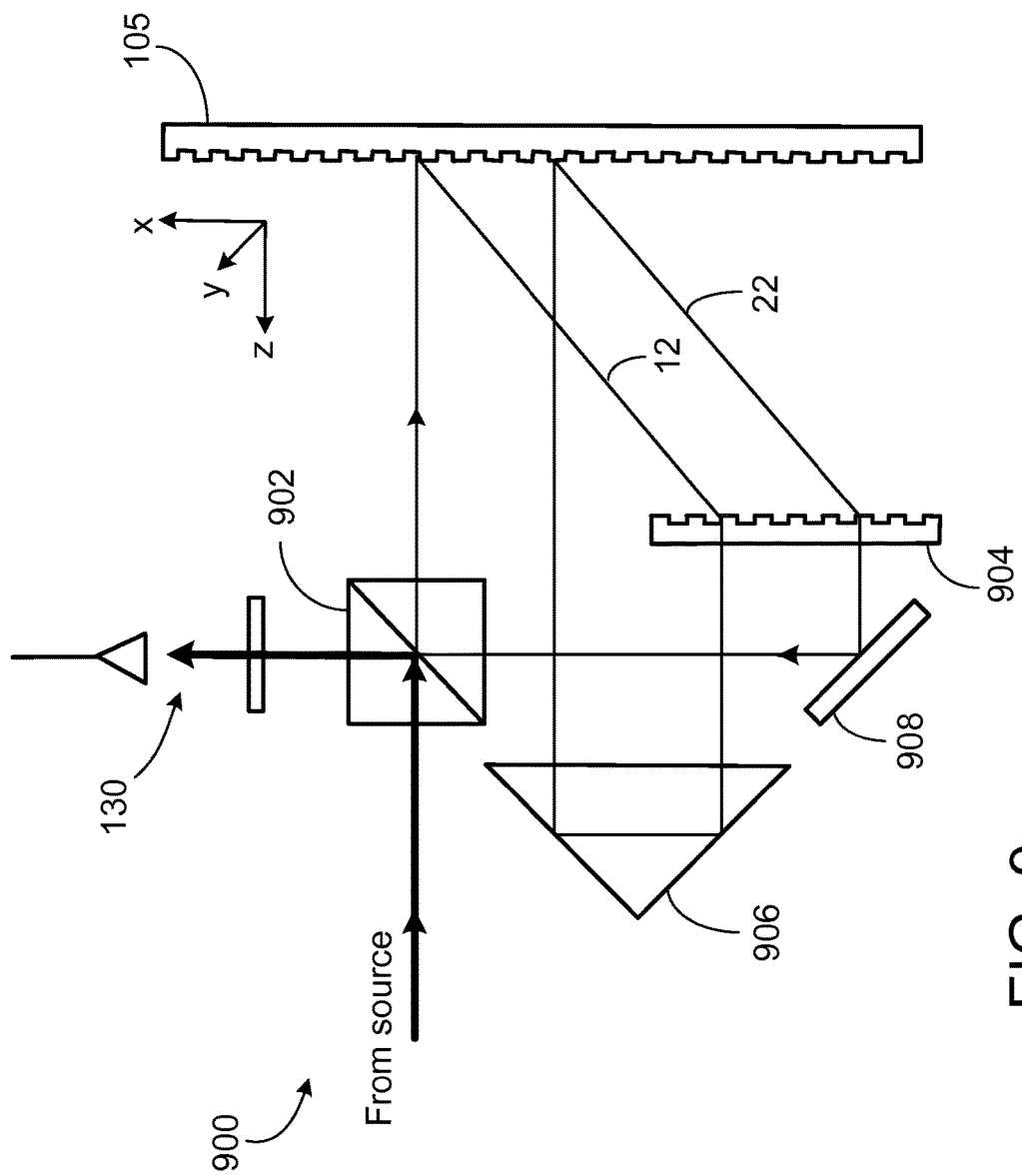

FIG. 9 is a schematic of an example double pass interferometric encoder system 900 that is another variation of the arrangement shown in FIG. 6. The encoder system 900 employs a transmission grating 904 for transmitting a first return beam 12 and a second return beam 22 from the encoder scale 105. The system 900 includes a retro-reflector 906 to redirect the first return beam 12 as a second incident beam 21 to the encoder scale 105, and includes a reflective component 908 to redirect a second return beam 22 that has passed through the transmission grating 904 towards the beam splitter 902. In some implementations, the arrangement shown in FIG. 9 improves the tolerance for tilting of the encoder scale 105 by compensating for the nonlinear diffraction behavior of the encoder scale 105 at different tilt angles.

Figure 10:
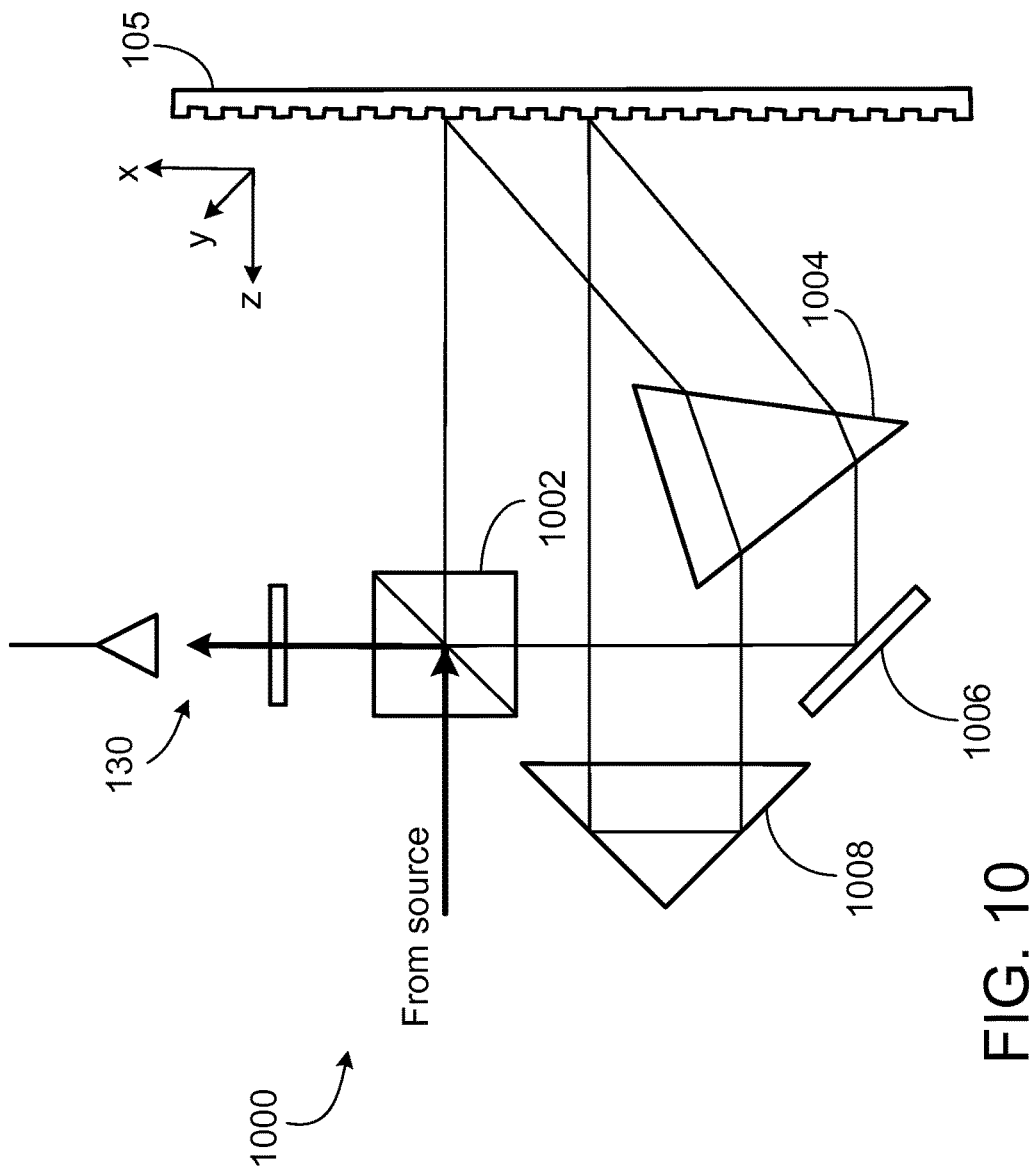

FIG. 10 is a schematic of an example double pass interferometric encoder system 1000 that is another variation of the arrangement shown in FIG. 6. The encoder system 1000 employs a prism component 1004 (e.g., a glass prism), a reflective component 1006 (e.g., mirror) and a retro-reflector 1008. In some implementations, the arrangement shown in FIG. 10 improves the tolerance for tilting of the encoder scale 105 by compensating for the nonlinear diffraction behavior of the encoder scale 105 at different tilt angles.

Figure 11A:
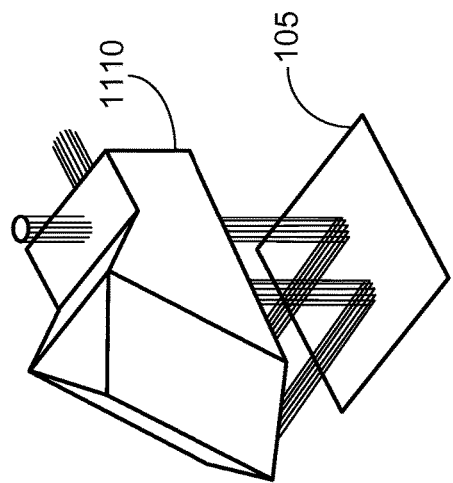
FIG. 11A is a schematic of an example optical component of an encoder head.
Figure 11B:
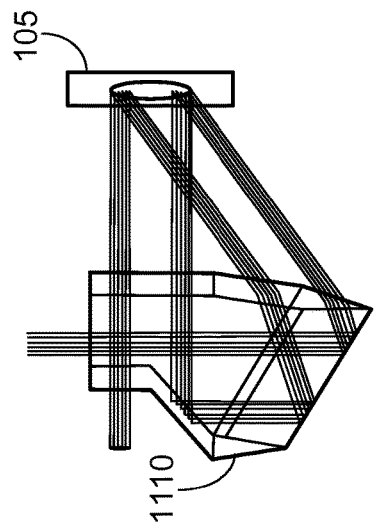
FIG. 11B is a three-dimensional schematic of the component shown in FIG. 11A.
Figure 11C:
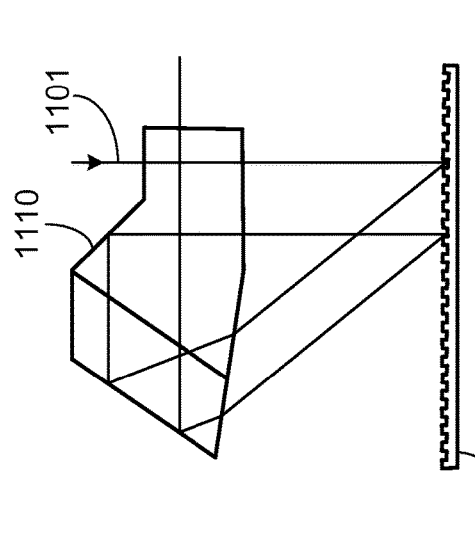
FIG. 11C is a schematic of the optical component shown in FIG. 11A.
Figure 11D:
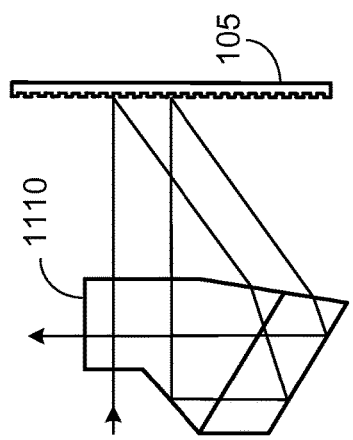
FIG. 11D is a three-dimensional schematic of the component shown in FIG. 11A.

In some embodiments, a single monolithic optical component can be used to cause the measurement beam to make two passes to the encoder scale. Using a single monolithic optical component can enable more compact encoder system designs as well as reduce alignment requirements. FIG. 11A is a schematic of a single monolithic optical component 1110 to redirect the measurement beam 1101 toward an encoder scale 105 using internal reflections within the body of the component 1110. FIG. 11B is a three-dimensional schematic of the component 1110 shown in FIG. 11A. FIG. 11C is an alternate view of the optical component 1110 shown in FIG. 11A. FIG. 11D is an alternate three-dimensional view of the component 1110. For the purpose of illustration, the reference beam and other optical components of the encoder system are not shown. The component 1110 can be formed from a suitable optically transparent material including, for example, glass. The component 1110 shown in FIGS. 11A-11D contains an implicit glass wedge in which the diffracted beams from the encoder scale 105 enter and exit the component 1110 with different angles as measured with respect to the normal of the encoder scale 105 and with respect to a surface normal of the component 1110. The surface angles of the optical component 1110 are optimized such that the nonlinear behavior of the refraction angles of the implicit wedge compensate for the nonlinear behavior of diffraction angles with respect to grating tilts of the encoder scale. Between the first and second interaction with the encoder scale 105, the measurement beam undergoes three internal reflections in the optical component 1110, similar to a beam path within a retro-reflector.

In some implementations, the encoder head configurations shown in FIG. 8 and FIG. 11 have the additional benefits of 1) being compensated for beam shear at the detector with z motion and 2) exhibiting little or no beam foreshortening, in contrast to the encoder head configurations of the embodiments shown in FIG. 2 and FIG. 3, which exhibit partial compensation for beam shear and foreshortening.

Figure 12:
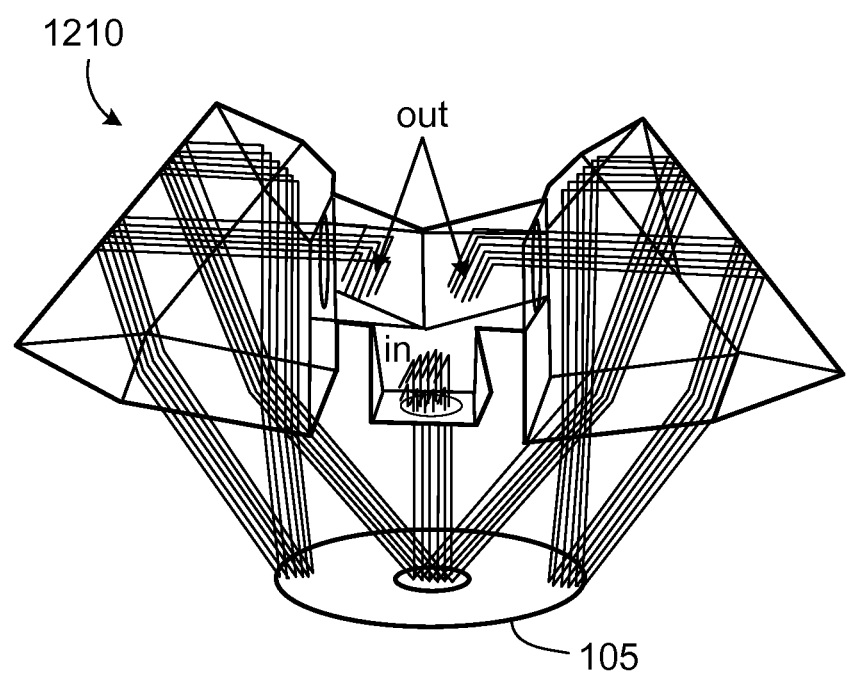
FIG. 12 is a three-dimensional schematic of an example optical component of an encoder head.

In some embodiments, the encoder head shown in FIG. 11 can be modified to improve efficiency. For example, FIG. 12 is a three-dimensional schematic of a monolithic optical component 1210 configured to receive two diffraction orders after the initial diffraction of the measurement beam as opposed to capturing a single diffraction order. For example, the optical component 1210 can be configured to receive both a the +1 and −1 diffracted beams from the encoder scale and redirect each of the +1 and −1 diffracted beams back to the encoder scale 105. Thus, two separate twice-diffracted measurement beams are output by the component 1210. Each of the two measurement beams can be combined with a reference beam to produce two output beams, which then can be used to calculate a position of the encoder scale 105 in two dimensions. For the purpose of illustration, the reference beam and other optical components of the encoder system are not shown. Again, the component 1210 can be formed from a suitable optically transparent material including, for example, glass.

Figure 13C:
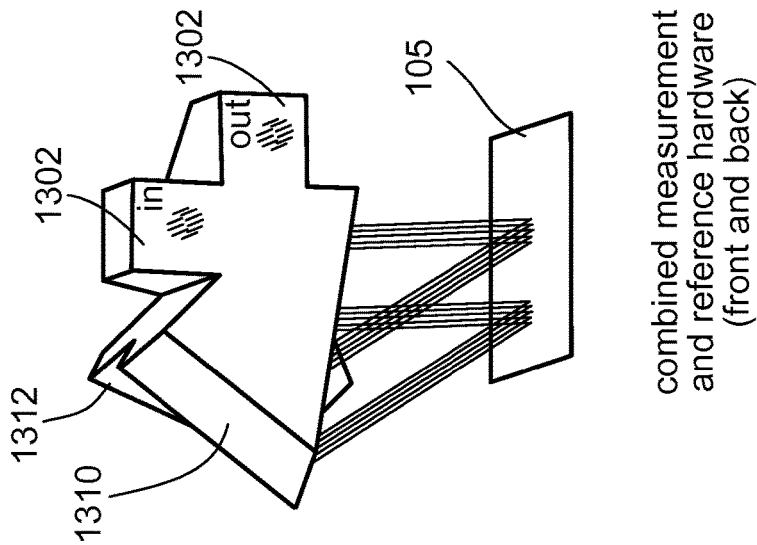
FIG. 13C is a three-dimensional schematic of the optical component shown in FIG. 13A optically coupled to the optical component shown in FIG. 13B.
Figure 13B:
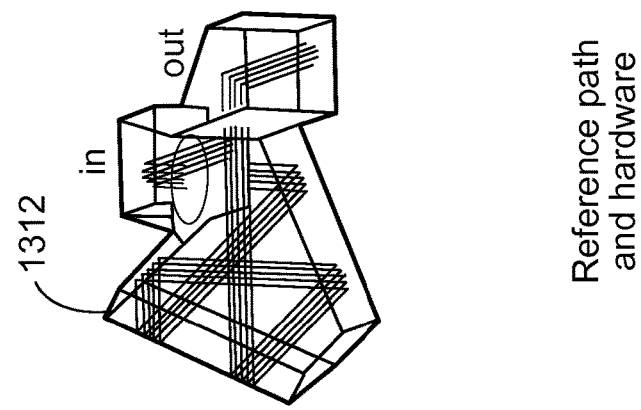
FIG. 13B is a three-dimensional schematic of a reference optical component for use with the optical component shown in FIG. 13A.
Figure 13A:
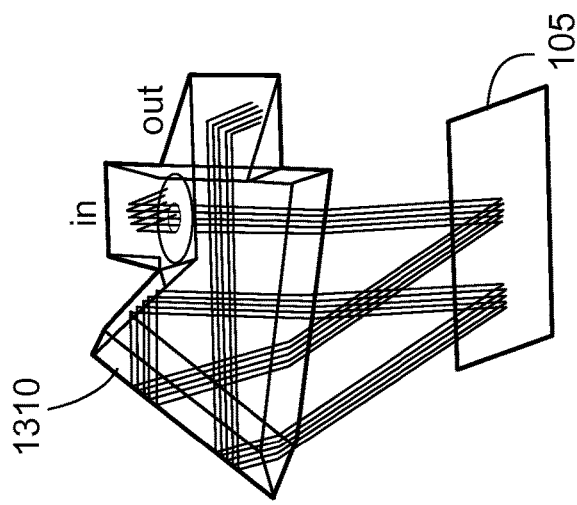
FIG. 13A is a three-dimensional schematic of a measurement optical component of an encoder head.

In some embodiments, the surfaces of the monolithic optical component that face the encoder scale 105 can be combined in a single continuous flat surface. For example, FIG. 13A is a three-dimensional schematic of a monolithic optical component 1310 in which the measurement beam exits and enters the optical component 1310 through a single flat surface 1302 of the component 1310. FIG. 13B is a three-dimensional schematic of a monolithic optical component 1312 for use with the optical component 1310 in which the optical component 1312 is configured to receive a reference beam. The optical component 1310 and component 1312 are configured such that the optical path length of the measurement beam 1305 through component 1310 is equal to the optical path length of the reference beam. FIG. 13C is a three-dimensional schematic of the optical component 1310 optically coupled to the optical component 1312 to produce an output beam that is a combination of the twice-diffracted measurement beam and the reference beam.

In some implementations, the optical component 1310 and component 1312 can be combined into a single monolithic optical component. In some implementations, the configuration shown in FIG. 13C has the advantage of being relatively compact. In addition, the encoder head configuration shown in FIG. 13C can assure similar output beam behavior with respect to input beam alignment errors caused by tilt and beam shearing.

Figures 14A, 14B:
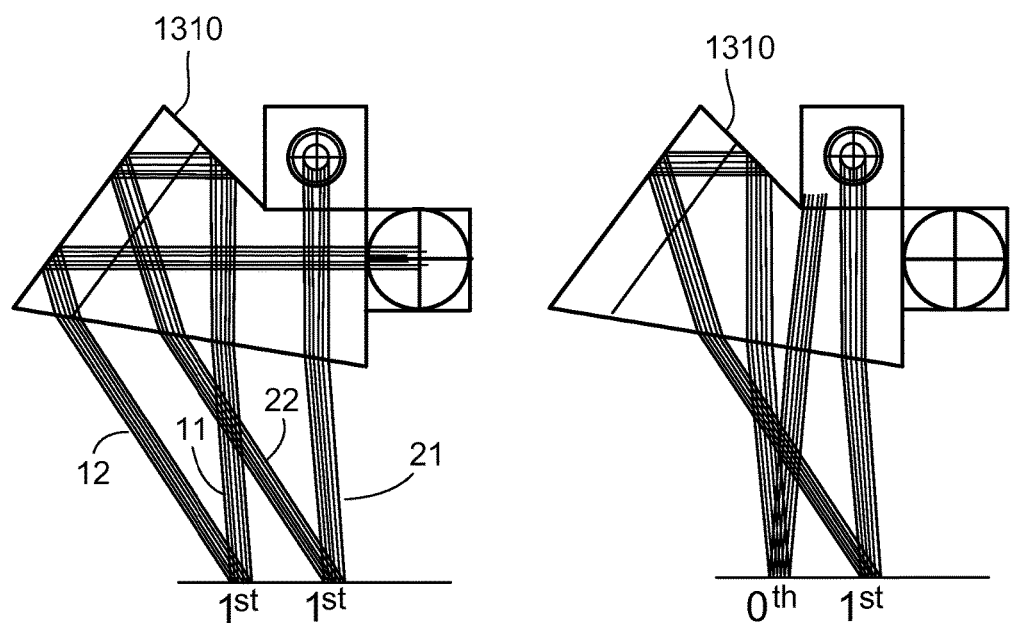
FIGS. 14A and 14B are two-dimensional schematics each showing a cross-section of the optical component of FIG. 13A.

FIG. 14A is a two-dimensional schematic a cross-section of the optical component 1310 of FIG. 13A showing that the first return beam 12 corresponds to the $1^{st}$ order diffracted beam of the incident measurement beam 11 and that the second return beam 22 corresponds to the $1^{st}$ order diffracted beam of the second incident measurement beam 21. In contrast, FIG. 14B is a two-dimensional schematic of the same cross-section in FIG. 14A showing that spurious beams, such as the $0^{th}$ order diffracted beam, follow a beam path that cannot be redirected by the optical component to be co-linear with the desired measurement beam. Accordingly, measurement errors caused by the interference of spurious beams with the measurement beam can be reduced.

In general, any of the analysis methods described above, including determining phase information from detected interference signals and degree of freedom information of the encoder scales, can be implemented in computer hardware or software, or a combination of both. For example, in some embodiments, electronic processor 150 can be installed in a computer and connected to one or more encoder systems and configured to perform analysis of signals from the encoder systems. Analysis can be implemented in computer programs using standard programming techniques following the methods described herein. Program code is applied to input data (e.g., interferometric phase information) to perform the functions described herein and generate output information (e.g., degree of freedom information). The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis methods can also be implemented as a computer-readable storage medium, configured with a computer program, where the storage medium so configured causes a computer to operate in a specific and predefined manner to perform the functions described herein.

Lithography Tool Applications

Lithography tools are especially useful in lithography applications used in fabricating large scale integrated circuits such as computer chips and the like. Lithography is the key technology driver for the semiconductor manufacturing industry. Overlay improvement is one of the five most difficult challenges down to and below 22 nm line widths (design rules), see, for example, the International Technology Roadmap for Semiconductors, pp. 58-59 (2009).

Overlay depends directly on the performance, i.e., accuracy and precision, of the metrology system used to position the wafer and reticle (or mask) stages. Since a lithography tool may produce $50-100M/year of product, the economic value from improved metrology systems is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer. In certain lithography tools, e.g., lithography scanners, the mask is also positioned on a translatable stage that is moved in concert with the wafer during exposure.

Encoder systems, such as those discussed previously, are important components of the positioning mechanisms that control the position of the wafer and reticle, and register the reticle image on the wafer. If such encoder systems include the features described above, the accuracy of distances measured by the systems can be increased and/or maintained over longer periods without offline maintenance, resulting in higher throughput due to increased yields and less tool downtime.

In general, the lithography tool, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Encoder systems described above can be used to precisely measure the positions of each of the wafer stage and mask stage relative to other components of the exposure system, such as the lens assembly, radiation source, or support structure. In such cases, the encoder system's optical assembly can be attached to a stationary structure and the encoder scale attached to a movable element such as one of the mask and wafer stages. Alternatively, the situation can be reversed, with the optical assembly attached to a movable object and the encoder scale attached to a stationary object.

More generally, such encoder systems can be used to measure the position of any one component of the exposure system relative to any other component of the exposure system, in which the optical assembly is attached to, or supported by, one of the components and the encoder scale is attached, or is supported by the other of the components.

Figure 15:
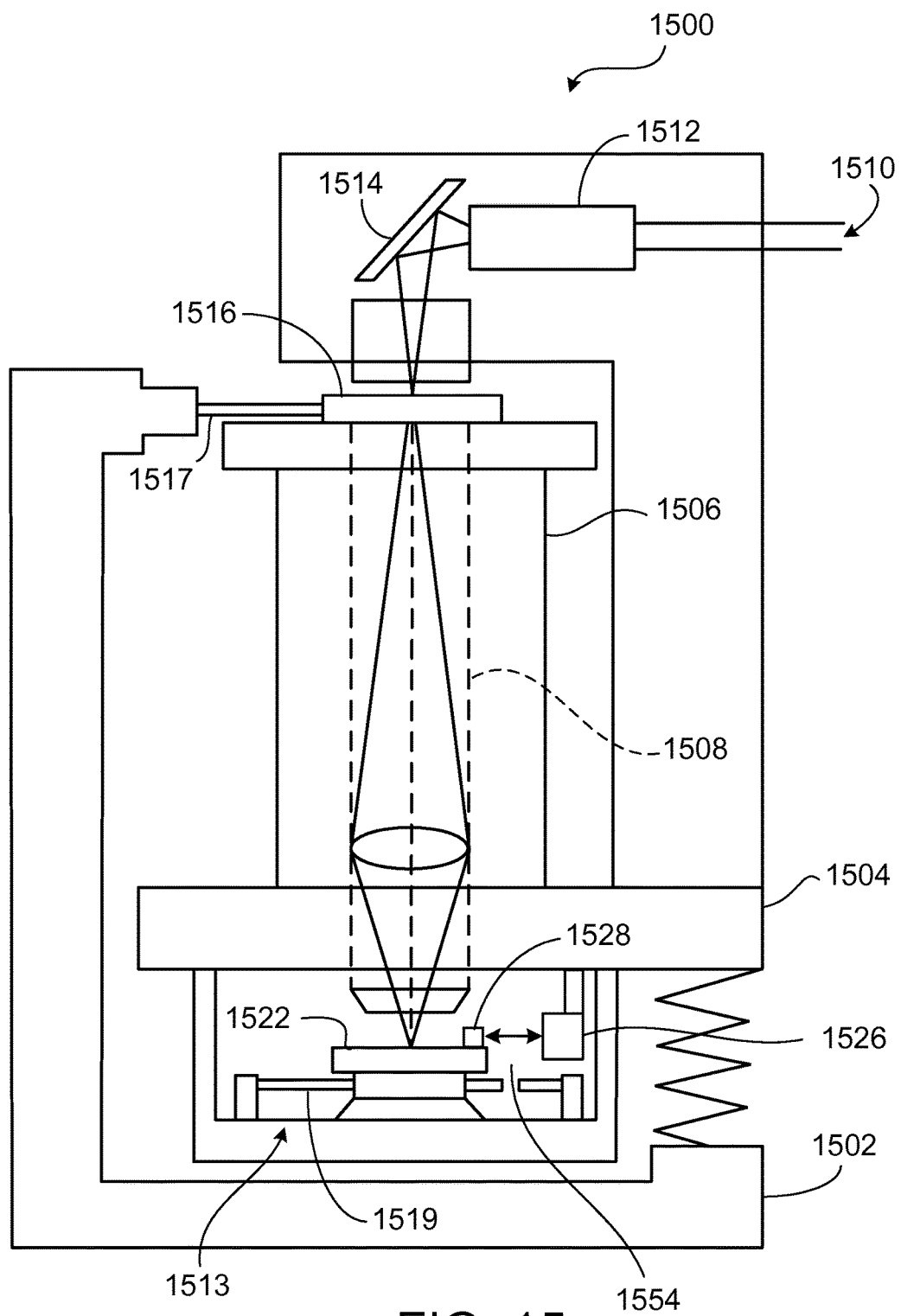
FIG. 15 is a schematic diagram of an embodiment of a lithography tool that includes a double pass interferometric encoder system.

An example of a lithography tool 1500 using an interferometry system 1526 is shown in FIG. 15. The encoder system is used to precisely measure the position of a wafer (not shown) within an exposure system. Here, stage 1522 is used to position and support the wafer relative to an exposure station. Scanner 1500 includes a frame 1502, which carries other support structures and various components carried on those structures. An exposure base 1504 has mounted on top of it a lens housing 1506 atop of which is mounted a reticle or mask stage 1516, which is used to support a reticle or mask. A positioning system for positioning the mask relative to the exposure station is indicated schematically by element 1517. Positioning system 1517 can include, e.g., piezoelectric transducer elements and corresponding control electronics. Although, it is not included in this described embodiment, one or more of the encoder systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1504 is a support base 1513 that carries wafer stage 1522. Stage 1522 includes a measurement object 1528 for diffracting a measurement beam 1554 directed to the stage by optical assembly 1526. A positioning system for positioning stage 1522 relative to optical assembly 1526 is indicated schematically by element 1519. Positioning system 1519 can include, e.g., piezoelectric transducer elements and corresponding control electronics. The measurement object diffracts the measurement beam reflects back to the optical assembly, which is mounted on exposure base 1504. The encoder system can be any of the embodiments described previously.

During operation, a radiation beam 1510, e.g., an ultraviolet (UV) beam from a UV laser (not shown), passes through a beam shaping optics assembly 1512 and travels downward after reflecting from mirror 1514. Thereafter, the radiation beam passes through a mask (not shown) carried by mask stage 1516. The mask (not shown) is imaged onto a wafer (not shown) on wafer stage 1522 via a lens assembly 1508 carried in a lens housing 1506. Base 1504 and the various components supported by it are isolated from environmental vibrations by a damping system depicted by spring 1520.

In some embodiments, one or more of the encoder systems described previously can be used to measure displacement along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In certain embodiments, the optical assembly 1526 can be positioned to measure changes in the position of reticle (or mask) stage 1516 or other movable components of the scanner system. Finally, the encoder systems can be used in a similar fashion with lithography systems involving steppers, in addition to, or rather than, scanners.

Figure 16A:
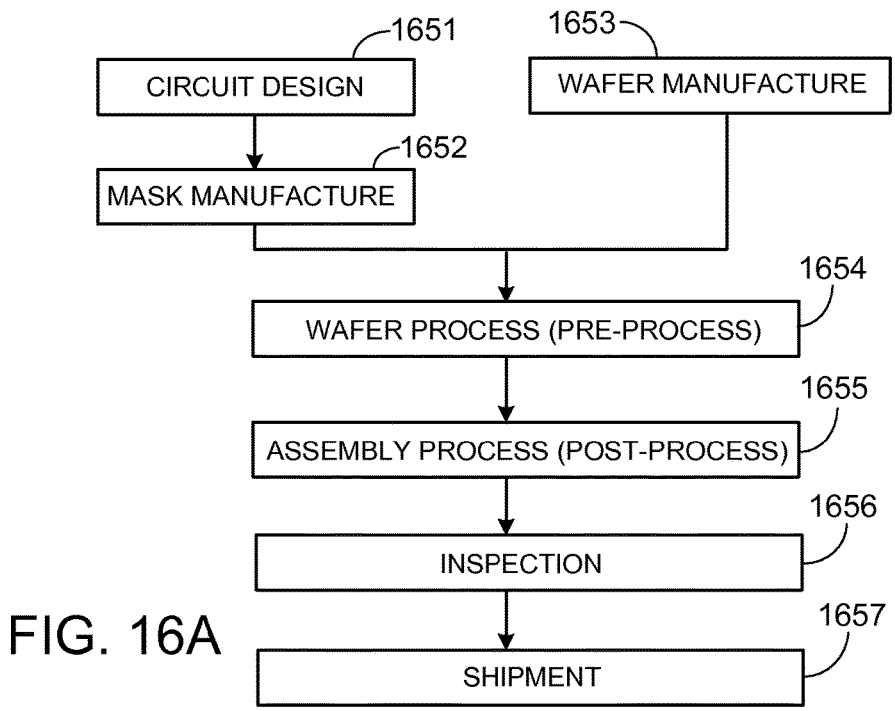
FIG. 16A and FIG. 16B are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 16A and 16B. FIG. 16A is a flow chart of the sequence of manufacturing a semiconductor device such as a semiconductor chip (e.g., IC or LSI), a liquid crystal panel or a CCD. Step 1651 is a design process for designing the circuit of a semiconductor device. Step 1652 is a process for manufacturing a mask on the basis of the circuit pattern design. Step 1653 is a process for manufacturing a wafer by using a material such as silicon.

Step 1654 is a wafer process that is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1655 is an assembling step, which is called a post-process wherein the wafer processed by step 1654 is formed into semiconductor chips. This step includes assembling (dicing and bonding) and packaging (chip sealing). Step 1656 is an inspection step wherein operability check, durability check and so on of the semiconductor devices produced by step 1655 are carried out. With these processes, semiconductor devices are finished and they are shipped (step 1657).

Figure 16B:
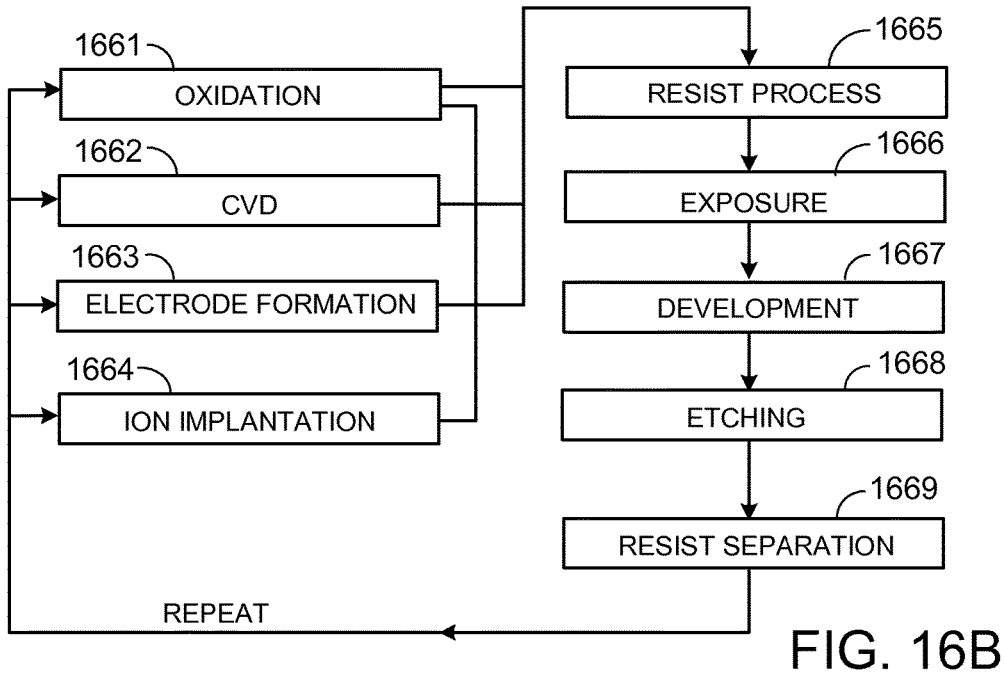

FIG. 16B is a flow chart showing details of the wafer process. Step 1661 is an oxidation process for oxidizing the surface of a wafer. Step 1662 is a CVD process for forming an insulating film on the wafer surface. Step 1663 is an electrode forming process for forming electrodes on the wafer by vapor deposition. Step 1664 is an ion implanting process for implanting ions to the wafer. Step 1665 is a resist process for applying a resist (photosensitive material) to the wafer. Step 1666 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1667 is a developing process for developing the exposed wafer. Step 1668 is an etching process for removing portions other than the developed resist image. Step 1669 is a resist separation process for separating the resist material remaining on the wafer after being subjected to the etching process. By repeating these processes, circuit patterns are formed and superimposed on the wafer.

The encoder systems described above can also be used in other applications in which the relative position of an object needs to be measured precisely. For example, in applications in which a write beam such as a laser, x-ray, ion, or electron beam, marks a pattern onto a substrate as either the substrate or beam moves, the encoder systems can be used to measure the relative movement between the substrate and write beam.

A number of embodiments have been described. Nevertheless, it will be understood that various modifications may be made. Other embodiments are within the scope of the claims.

What is claimed is:

1. An encoder system comprising:
an encoder head for use with a diffractive encoder scale extending in an encoder plane, wherein the encoder head comprises a plurality of optical components configured and arranged to:
  i) direct a first incident beam to the diffractive encoder scale at a first incident angle with respect to a normal to the encoder plane;
  ii) receive a first return beam from the diffractive encoder scale at a first return angle with respect to the normal to the encoder plane, the first return angle being different from the first incident angle;
  iii) redirect the first return beam to the diffractive encoder scale as a second incident beam at a second incident angle with respect to the normal to the encoder plane;
  iv) receive a second return beam back from the diffractive encoder scale at a second return angle with respect to the normal to the encoder plane, the second return angle being different from the second incident angle; and
  v) maintain a difference between the first incident angle and the second incident angle that is less than a difference between the first incident angle and the first return angle and that is less than a difference between the second incident angle and the second return angle.

2. The encoder system of claim 1, wherein the plurality of optical components are configured and arranged to compensate for a nonlinear change in the first return angle.

3. The encoder system of claim 2, wherein the plurality of optical components comprises a diffraction grating, a first optical component and a second optical component, wherein the diffraction grating is configured and arranged to:
receive the first return beam and the second return beam from the diffractive encoder scale;
transmit the first return beam to the first optical component; and
transmit the second return beam to the second optical component.

4. The encoder system of claim 3, wherein the first optical component is a retro-reflector and is configured and arranged to redirect the first return beam to the diffractive encoder scale as the second incident beam.

5. The encoder system of claim 3, wherein the second optical component comprises a mirror.

6. The encoder system of claim 5, wherein the encoder head further comprises a beam-splitting component, and the mirror is configured and arranged to redirect the second return beam to the beam-splitting component.

7. The encoder system of claim 3, wherein the diffraction grating is configured and arranged to transmit the first return beam as a first diffracted beam and to transmit the second return beam as a second diffracted beam.

8. The encoder system of claim 2, wherein the plurality of optical components comprises a prism component, a first optical component and a second optical component, wherein the prism component is configured and arranged to:
receive the first return beam and the second return beam from the diffractive encoder scale;
transmit the first return beam to the first optical component; and
transmit the second return beam to the second optical component.

9. The encoder system of claim 8, wherein the first optical component is a retro-reflector and is configured and arranged to redirect the first return beam to the diffractive encoder scale as the second incident beam.

10. The encoder system of claim 8, wherein the second optical component comprises a mirror.

11. The encoder system of claim 10, wherein the encoder head further comprises a beam-splitting component, and the mirror is configured and arranged to redirect the second return beam to the beam-splitting component.

12. The encoder system of claim 8, wherein the prism component is configured and arranged to refract the first return beam towards first optical component and refract the second return beam towards the second optical component.

13. The encoder system of claim 8, wherein the prism component is a refractive wedge prism.

14. The encoder system of claim 1, comprising:
a detector; and
an electronic processor,
wherein the encoder head is configured and arranged to combine the second return beam with a reference beam to form an output beam,
wherein the detector is positioned to detect the output beam, and
wherein the electronic processor configured to:
receive an interference signal from the detector, the interference signal comprising a phase related to an optical path difference between the reference beam and the second return beam; and
determine information about a change in position of the diffractive encoder scale based on the phase.

15. The encoder system of claim 1, comprising the diffractive encoder scale.

16. An encoder system comprising:
an encoder head for use with a diffractive encoder scale extending in an encoder plane, wherein the encoder head comprises one or more optical components configured and arranged to:
i) direct a first incident beam to the diffractive encoder scale at a first incident angle with respect to a normal to the encoder plane;
ii) receive a plurality of first return beams from the diffractive encoder scale, each first return beam being associated with a corresponding first return angle with respect to the normal to the encoder plane, each first return angle being different from the first incident angle;
iii) redirect the plurality of first return beams to the diffractive encoder scale as a plurality of second incident beams, each second incident beam being associated with a corresponding second incident angle with respect to the normal to the encoder plane; and
iv) for each second incident beam, receive a corresponding second return beam back from the diffractive encoder scale, each second return beam being associated with a corresponding second return angle with respect to the normal to the encoder plane, each second incident angle being different from the second return angle of the corresponding second return beam,
wherein a difference between the first incident angle and each second incident angle is less than a difference between the first incident angle and each first return angle, and is less than a difference between each second incident angle and the second return angle of the corresponding second return beam.

17. The encoder system of claim 16, comprising:
at least one detector; and
an electronic processor,
wherein the encoder head is configured and arranged to combine each second return beam with a corresponding reference beam to form a plurality of output beams,
wherein the at least one detector is positioned to detect the plurality of output beams, and
wherein the electronic processor configured to:
receive a plurality of interference signals from the at least one detector, each interference signal comprising, for a corresponding detected output beam, a phase related to an optical path difference between the reference beam and the second return beam of the detected output beam; and
determine information about a change in position of the diffractive encoder scale based on the phase from each interference signal.

18. The encoder system of claim 17, wherein the electronic processor is configured to determine information about a change in position of the diffractive encoder scale along at least two different directions.

19. The encoder system of claim 16, wherein the one or more optical components comprise a single monolithic optical component.

20. The encoder system of claim 16, wherein each of the first return beams corresponds to a diffracted beam having a different diffraction order.

21. The encoder system of claim 16, comprising the diffractive encoder scale.

22. The encoder system of claim 21, wherein the encoder scale comprises a one dimensional or a two dimensional grating.

23. A system comprising:
a moveable stage;
a diffractive encoder scale extending in an encoder plane; and
an encoder system comprising an encoder head, wherein the encoder head comprises a plurality of optical components configured and arranged to
i) direct a first incident beam to the diffractive encoder scale at a first incident angle with respect to a normal to the encoder plane,
ii) receive a first return beam from the diffractive encoder scale at a first return angle with respect to the normal to the encoder plane, the first return angle being different from the first incident angle,
iii) redirect the first return beam to the diffractive encoder scale as a second incident beam at a second incident angle with respect to the normal to the encoder plane,
iv) receive a second return beam back from the diffractive encoder scale at a second return angle with respect to the normal to the encoder plane, the second return angle being different from the second incident angle, and
v) maintain a difference between the first incident angle and the second incident angle that is less than a difference between the first incident angle and the first return angle and that is less than a difference between the second incident angle and the second return angle, wherein either the encoder system or the encoder scale is attached to the moveable stage.

24. A lithography system comprising:

a diffractive encoder scale extending in an encoder plane;

an encoder system comprising an encoder head, wherein the encoder head comprises a plurality of optical components configured and arranged to
  i) direct a first incident beam to the diffractive encoder scale at a first incident angle with respect to a normal to the encoder plane,
  ii) receive a first return beam from the diffractive encoder scale at a first return angle with respect to the normal to the encoder plane, the first return angle being different from the first incident angle,
  iii) redirect the first return beam to the diffractive encoder scale as a second incident beam at a second incident angle with respect to the normal to the encoder plane,
  iv) receive a second return beam back from the diffractive encoder scale at a second return angle with respect to the normal to the encoder plane, the second return angle being different from the second incident angle, and
  v) maintain a difference between the first incident angle and the second incident angle that is less than a difference between the first incident angle and the first return angle and that is less than a difference between the second incident angle and the second return angle;

a moveable stage, wherein either the encoder system or the encoder scale is attached to the moveable stage;

an illumination system coupled to the encoder system, the illumination system including a radiation source, wherein during operation of the lithography system, the source directs radiation to the encoder system;

a detector to detect, during operation of the lithography system, an output beam from the encoder system;

an electronic processor configured to:
  receive an interference signal from the detector, the interference signal comprising a phase related to an optical path difference; and
  determine information about relative displacement of the encoder scale based on the phase; and a positioning system coupled to the electronic processor and configured to adjust the position of the stage based on the information about the relative displacement of the encoder scale.

25. A system comprising:

a moveable stage;

a diffractive encoder scale extending in an encoder plane; and an encoder system comprising an encoder head, wherein the encoder head comprises a one or more optical components optical components configured and arranged to
  i) direct a first incident beam to the diffractive encoder scale at a first incident angle with respect to a normal to the encoder plane,
  ii) receive a plurality of first return beams from the diffractive encoder scale, each first return beam being associated with a corresponding first return angle with respect to the normal to the encoder plane, each first return angle being different from the first incident angle,
  iii) redirect the plurality of first return beams to the diffractive encoder scale as a plurality of second incident beams, each second incident beam being associated with a corresponding second incident angle with respect to the normal to the encoder plane, and
  iv) for each second incident beam, receive a corresponding second return beam back from the diffractive encoder scale, each second return beam being associated with a corresponding second return angle with respect to the normal to the encoder plane, each second incident angle being different from the second return angle of the corresponding second return beam, wherein a difference between the first incident angle and each second incident angle is less than a difference between the first incident angle and each first return angle, and is less than a difference between each second incident angle and the second return angle of the corresponding second return beam, and wherein either the encoder system or the encoder scale is attached to the moveable stage.

26. A lithography system comprising:

a diffractive encoder scale extending in an encoder plane;

an encoder system comprising an encoder head, wherein the encoder head comprises one or more optical components optical components configured and arranged to
  i) direct a first incident beam to the diffractive encoder scale at a first incident angle with respect to a normal to the encoder plane,
  ii) receive a plurality of first return beams from the diffractive encoder scale, each first return beam being associated with a corresponding first return angle with respect to the normal to the encoder plane, each first return angle being different from the first incident angle,
  iii) redirect the plurality of first return beams to the diffractive encoder scale as a plurality of second incident beams, each second incident beam being associated with a corresponding second incident angle with respect to the normal to the encoder plane, and
  iv) for each second incident beam, receive a corresponding second return beam back from the diffractive encoder scale, each second return beam being associated with a corresponding second return angle with respect to the normal to the encoder plane, each second incident angle being different from the second return angle of the corresponding second return beam, wherein a difference between the first incident angle and each second incident angle is less than a difference between the first incident angle and each first return angle, and is less than a difference between each second incident angle and the second return angle of the corresponding second return beam;

a moveable stage, wherein either the encoder system or the encoder scale is attached to the moveable stage;

an illumination system coupled to the encoder system, the illumination system including a radiation source, wherein during operation of the lithography system, the source directs radiation to the encoder system;

a detector to detect, during operation of the lithography system, an output beam from the encoder system;

an electronic processor configured to:
receive an interference signal from the detector, the interference signal comprising a phase related to an optical path difference; and
determine information about relative displacement of the encoder scale based on the phase; and
a positioning system coupled to the electronic processor and configured to adjust the position of the stage based on the information about the relative displacement of the encoder scale.

27. A method comprising:
directing, from an encoder head, a first incident beam to a diffractive encoder scale at a first incident angle with respect to a normal to the encoder scale;
receiving, at the encoder head, a first return beam from the diffractive encoder scale at a first return angle with respect to the normal to the encoder plane, the first return angle being different from the first incident angle;
redirecting, from the encoder head, the first return beam to the diffractive encoder scale as a second incident beam at a second incident angle with respect to the normal to the encoder plane; and
receiving, at the encoder head, a second return beam back from the diffractive encoder scale at a second return angle with respect to the normal to the encoder plane, the second return angle being different from the second incident angle,
wherein a difference between the first incident angle and the second incident angle is less than a difference between the first incident angle and the first return angle, and less than a difference between the second incident angle and the second return angle.

28. The method of claim 27, comprising:
combining, at the encoder head, the second return beam with a reference beam to form an output beam.

29. The method of claim 28, comprising:
detecting, at a detector, the output beam;
obtaining, at an electronic processor coupled to the detector, an interference signal produced at the detector in response to detecting the output beam, wherein the interference signal comprises a phase related to an optical path difference between the reference beam and the second return beam; and
determining information about a change in a position of the encoder scale based on a phase of the interference signal.

30. The method of claim 29, wherein the phase is a heterodyne phase.

31. The method of claim 28, comprising:
receiving, from an optical source, a source beam at a beam splitting component of the encoder head; and
splitting the source beam into the first incident beam and the reference beam at the beam splitting component.

32. The method of claim 31, comprising:
receiving the second return beam at a first optical component of the encoder head; and
redirecting the second return beam from the first optical component to the beam-splitting component.

33. The method of claim 32, comprising:
receiving, at the first optical component, the first return beam from the encoder scale;
redirecting the first return beam, from the first optical component, to a second optical component of the encoder head; and
redirecting the first return beam, from the second optical component, to the encoder scale as the second incident beam at the second incident angle.

34. The method of claim 28, comprising increasing a deviation between a beam path of the first return beam and a beam path of the reference beam.

35. The method of claim 27, comprising:
receiving, at a first optical component of the encoder head, the first return beam and the second return beam from the encoder scale;
redirecting, from the first optical component, the first return beam and the second return beam to a retro-reflector of the encoder head;
redirecting, from the retro-reflector, the second return beam to a beam-splitting component of the encoder head;
redirecting, from the retro-reflector, the first return beam to a second optical component of the encoder head; and
redirecting the first return beam, from the second optical component, to the encoder scale as the second incident beam at the second angle.

36. The method of claim 27, comprising:
receiving, at a diffraction grating, the first return beam and the second return beam from the diffractive encoder scale to provide a first diffracted beam and a second diffracted beam, respectively; and
redirecting, from the diffraction grating, the first diffracted beam to a first optical component.

37. The method of claim 36, wherein the first optical component is a mirror or a retro-reflector, and wherein the method further comprises redirecting the first diffracted beam from the first optical component to the encoder scale as the second incident beam at the second angle.

38. The method of claim 36, comprising:
redirecting, from the diffraction grating, the second diffracted beam to a beam-splitting component; and
combining, at the beam-splitting component, the second diffracted beam with a reference beam to produce an output beam.

39. The method of claim 27, comprising:
receiving, at a prism component of the encoder head, the first return beam and the second return beam; and
redirecting, from the prism component, the first return beam to the diffractive encoder scale as the second incident beam at the second angle.

40. The method of claim 38, further comprising:
redirecting, from the prism component, the second return beam to a beam-splitting component; and
combining, at the beam-splitting component, the second diffracted beam with a reference beam to produce the output beam.

41. The method of claim 27, wherein redirecting the first return beam to the diffractive encoder scale as a second incident beam comprises:
receiving the first return beam at a first prism component;
redirecting, from the first prism component, the first return beam to a reflecting component such that the first return beam is reflected to a second prism component; and
redirecting, from the second prism component, the first return beam to the encoder scale as the second incident beam.

42. The method of claim 27, comprising:
receiving, at a beam-splitting component of the encoder head, a source beam; and splitting, at the beam-splitting component, the source beam into the first incident beam and a first reference beam, wherein redirecting the first return beam to the diffractive encoder scale as a second incident beam comprises receiving the first incident beam at the beam-splitting component.

43. The method of claim 42, comprising:

redirecting, from the beam-splitting component, the first return beam through a first prism component of the encoder head to change an angle of propagation of the first return beam;

redirecting the first return beam, after passing through the first prism component, back to the beam-splitting component and through a second prism component to again change an angle of propagation of the first return beam.

44. The method of claim 43, comprising:

redirecting the first reference beam to a reference surface at a first reference angle;

receiving, at the beam-splitting component, a first return reference beam from the reference surface;

redirecting, the first return reference beam through the first prism component of the encoder head to change an angle of propagation of the first return reference beam;

redirecting the first return reference beam, after passing through the first prism component, back to the beam-splitting component and through a second prism component to again change an angle of propagation of the first return reference beam; and directing, from the beam-splitting component and after passing through the second prism component, the first return reference beam to the reference surface as a second reference beam at a second reference angle.

45. The method of claim 44, wherein the reference surface comprises the diffractive encoder scale.

46. The method of claim 27, wherein each of the first return beam and the second return beam is a diffracted beam.

47. The method of claim 46, wherein each diffracted beam is a first order diffracted beam.

48. The method of claim 27, wherein the first incident beam and the first return beam are non-co-linear and non-parallel, and the second incident beam and the second return beam are non-co-linear and non-parallel.

* * * * *